US012568749B2

(12) United States Patent
Lee et al.

(10) Patent No.: US 12,568,749 B2

(45) Date of Patent: Mar. 3, 2026

(54) DISPLAY DEVICE

(71) Applicant: Samsung Display Co., LTD., Yongin-si (KR)

(72) Inventors: Hyeon Bum Lee, Hwaseong-si (KR); Chi Wook An, Hwaseong-si (KR); Jung-Hyun Cho, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 659 days.

(21) Appl. No.: 17/707,943

(22) Filed: Mar. 29, 2022

(65) Prior Publication Data

US 2023/0094620 A1 Mar. 30, 2023

(30) Foreign Application Priority Data

Sep. 6, 2021 (KR) ........................ 10-2021-0118246

(51) Int. Cl.

*H10K 59/80* (2023.01)
*H10K 59/122* (2023.01)
*H10K 59/40* (2023.01)

(52) U.S. Cl.

CPC ......... *H10K 59/878* (2023.02); *H10K 59/122* (2023.02); *H10K 59/40* (2023.02); *H10K 59/8792* (2023.02); *H10K 59/873* (2023.02)

(58) Field of Classification Search

CPC .... H10K 50/844; H10K 50/856; H10K 50/86; H10K 59/40; H10K 59/121; H10K 59/122; H10K 59/873; H10K 59/878; H10K 59/8792

USPC ............................................................ 257/40

See application file for complete search history.

(56) References Cited

U.S. PATENT DOCUMENTS

| | | | | |
|---|---|---|---|---|
| 11,283,054 | B2 | 3/2022 | Moon et al. | |
| 11,825,685 | B2 | 11/2023 | Lee | |
| 11,943,966 | B2 | 3/2024 | Moon et al. | |
| 2011/0025199 | A1* | 2/2011 | Park | H10K 50/865 313/504 |
| 2019/0181189 | A1* | 6/2019 | Chang | H10K 59/12 |
| 2020/0295310 | A1* | 9/2020 | Moon | H10K 59/1315 |
| 2020/0357871 | A1* | 11/2020 | Chung | H10K 59/879 |
| 2021/0202631 | A1* | 7/2021 | Jo | H10K 59/1213 |

(Continued)

FOREIGN PATENT DOCUMENTS

| | | | |
|---|---|---|---|
| KR | 101816134 | B1 | 1/2018 |
| KR | 1020190069285 | A | 6/2019 |

(Continued)

*Primary Examiner* — Fazli Erdem

(74) *Attorney, Agent, or Firm* — CANTOR COLBURN LLP

(57) ABSTRACT

A display device according to an embodiment includes: a substrate; a light emitting element which is disposed on the substrate, and includes a first electrode, an emission layer, and a second electrode; a reflective layer which is disposed on the light emitting element, and includes an inorganic material; an encapsulation layer which is disposed on the reflective layer; a light blocking layer which is disposed on the encapsulation layer, and defines an opening overlapping the emission layer in a plan view; a reflection adjusting layer which is disposed on the light blocking layer; and a first organic layer which is disposed on the reflection adjusting layer, and defines an opening overlapping the emission layer in the plan view.

20 Claims, 19 Drawing Sheets

(56) References Cited

U.S. PATENT DOCUMENTS

| | | | | |
|---|---|---|---|---|
| 2021/0202661 | A1* | 7/2021 | Kim | H10K 59/131 |
| 2022/0293890 | A1* | 9/2022 | Jeong | H10K 50/865 |
| 2024/0057372 | A1 | 2/2024 | Lee | |

FOREIGN PATENT DOCUMENTS

| | | | |
|---|---|---|---|
| KR | 1020200071189 | A | 6/2020 |
| KR | 1020200110505 | A | 9/2020 |
| KR | 1020210078875 | A | 6/2021 |
| KR | 1020210099246 | A | 8/2021 |

* cited by examiner

DISPLAY DEVICE

This application claims priority to Korean Patent Application No. 10-2021-0118246, filed on Sep. 6, 2021, and all the benefits accruing therefrom under 35 U.S.C. § 119, the content of which in its entirety is herein incorporated by reference.

BACKGROUND

(a) Field

Embodiments of the present invention relate to a display device, and more particularly, they relate to a display device of which transmittance is improved in an element area.

(b) Description of the Related Art

As a device that displays a screen, a display device includes a liquid crystal display ("LCD"), an organic light emitting diode display ("OLED"), and the like. Such a display device is used in various electronic devices such as portable phones, navigation devices, digital cameras, electronic books, portable game machines, or various terminals.

The above information disclosed in this Background section is only for enhancement of understanding of the background of the invention, and therefore it may contain information that does not form the prior art that is already known in this country to a person of ordinary skill in the art.

SUMMARY

Embodiments of the present invention are to provide a display device having improved transmittance in a certain area by removing the reflection adjusting layer from the certain area, and covering it with an organic layer. However, these tasks are exemplary, and the scope of the present invention is not limited thereby.

A display device according to an embodiment includes: a substrate; a light emitting element which is disposed on the substrate, and includes a first electrode, an emission layer, and a second electrode; a reflective layer which is disposed on the light emitting element, and includes an inorganic material; an encapsulation layer which is disposed on the reflective layer; a light blocking layer which is disposed on the encapsulation layer, and defines a 2-1 opening overlapping the emission layer in a plan view; a reflection adjusting layer which is disposed on the light blocking layer; and a first organic layer which is disposed on the reflection adjusting layer, and defines an opening overlapping the emission layer in the plan view.

The display device may include: a display area and a peripheral area which surrounds the display area, and the display area may include a first element area and a second element area.

The display device may further include: a pixel defining layer which is disposed on the substrate, and includes a light blocking material, and the pixel defining layer may define: a 1-1 opening overlapping at least a part of the first electrode in the plan view; a 1-2 opening overlapping the first element area in the plan view; and a 1-3 opening overlapping the second element area in the plan view.

The light blocking layer may define: the 2-1 opening overlapping the 1-1 opening in the plan view; a 2-2 opening overlapping the 1-2 opening in the plan view; and a 2-3 opening overlapping the 1-3 opening in the plan view.

The reflection adjusting layer may define a 3-1 opening overlapping the first element area in the plan view and a 3-2 opening overlapping the second element area in the plan view.

The first organic layer may be disposed in the 3-1 opening.

The first organic layer may be disposed in the 3-2 opening.

The display device may further include a spacer disposed on the pixel defining layer.

The display device may further include a second organic layer disposed on the first organic layer, and a refractive index of the second organic layer may be greater than a refractive index of the first organic layer.

The first organic layer may overlap the entire surface of the substrate in the plan view.

The reflective layer may include ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof.

The reflective layer may overlap a front surface of the substrate in the plan view.

The reflective layer may define an opening which overlaps at least one of the first element area and the second element area in the plan view.

The reflection adjusting layer may selectively absorb a first wavelength region and a second wavelength region in a visible light region, and the first wavelength region may be 480 nanometers (nm) to 505 nm, and the second wavelength region may be 585 nm to 605 nm.

A display device according to an embodiment includes: a substrate comprising a display area and a peripheral area; a light emitting element which is disposed on the substrate, and includes a first electrode, an emission layer, and a second electrode; a pixel defining layer which overlaps at least a part of the first electrode in the plan view, and includes a light blocking material; a reflective layer which is disposed on the second electrode, and contains an inorganic material; an encapsulation layer which is disposed on the reflective layer; a light blocking layer which is disposed on the encapsulation layer; and a reflection adjusting layer and a first organic layer which are disposed on the light blocking layer.

The display device may include a first element area and a second element area which are disposed in the display area.

The reflection adjusting layer may be spaced apart from the first element area and at least a part of the second element area in the plan view.

The first organic layer may overlap the first element area and the second element area in the plan view, and the pixel defining layer and the light blocking layer may be spaced apart from the first element area and the at least a part of the second element area in the plan view.

The reflective layer may overlap a front surface of the substrate in the plan view.

The reflective layer may define an opening which overlaps the first element area and an opening which overlaps the second element area in the plan view.

According to the embodiments of the present invention, it is possible to implement a display device having improved transmittance in the first element area and the second element area. The scope of the present invention is not limited by such an effect.

DETAILED DESCRIPTION

Figure 1:
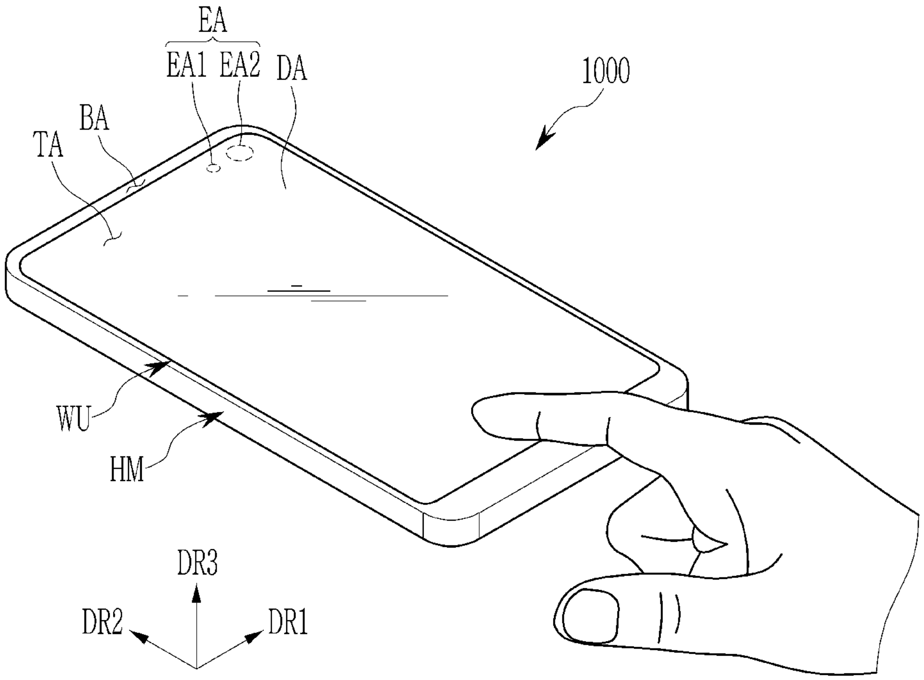
FIG. 1 is a schematic perspective view that illustrates a use state of a display device according to an embodiment.

The present invention will be described more fully hereinafter with reference to the accompanying drawings, in which embodiments of the invention are shown. As those skilled in the art would realize, the described embodiments may be modified in various different ways.

The drawings and description are to be regarded as illustrative in nature and not restrictive. Like reference numerals designate like elements throughout the specification.

In addition, since the size and thickness of each configuration shown in the drawings are arbitrarily indicated for better understanding and ease of description, the present invention is not necessarily limited to the drawings. In the drawings, the thickness of layers, films, panels, regions, etc., are exaggerated for clarity. In addition, in the drawings, the thickness of some layers and regions is exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. It will be understood that when an element such as a layer, film, region, or substrate is referred to as being "on" another element, it can be directly on the other element or intervening elements may also be present.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a plane" means viewing a target portion from the top (i.e., in a third direction DR3, in a plan view), and the phrase "on a cross-section" means viewing a cross-section formed by vertically cutting a target portion from the side.

Figure 2:
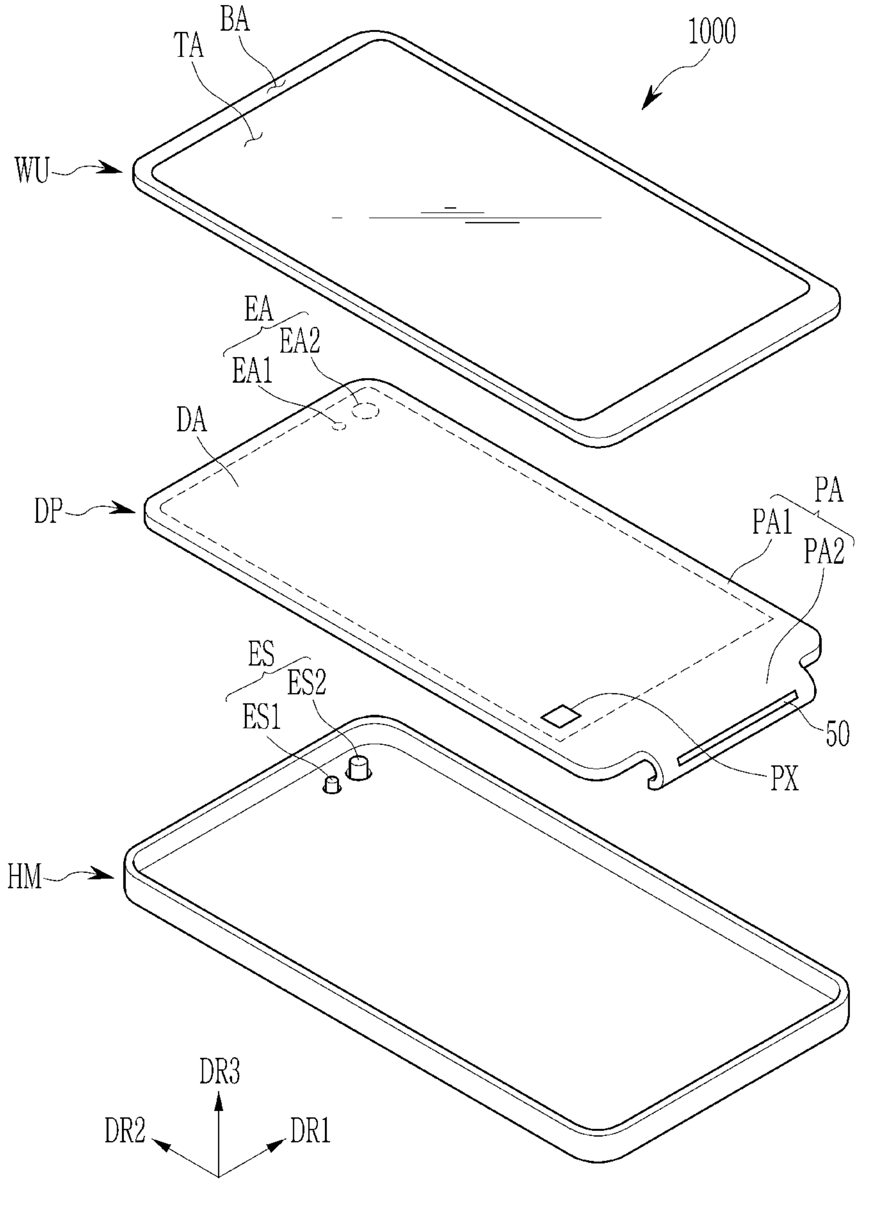
FIG. 2 is an exploded perspective view of the display device according to the embodiment.
Figure 3:
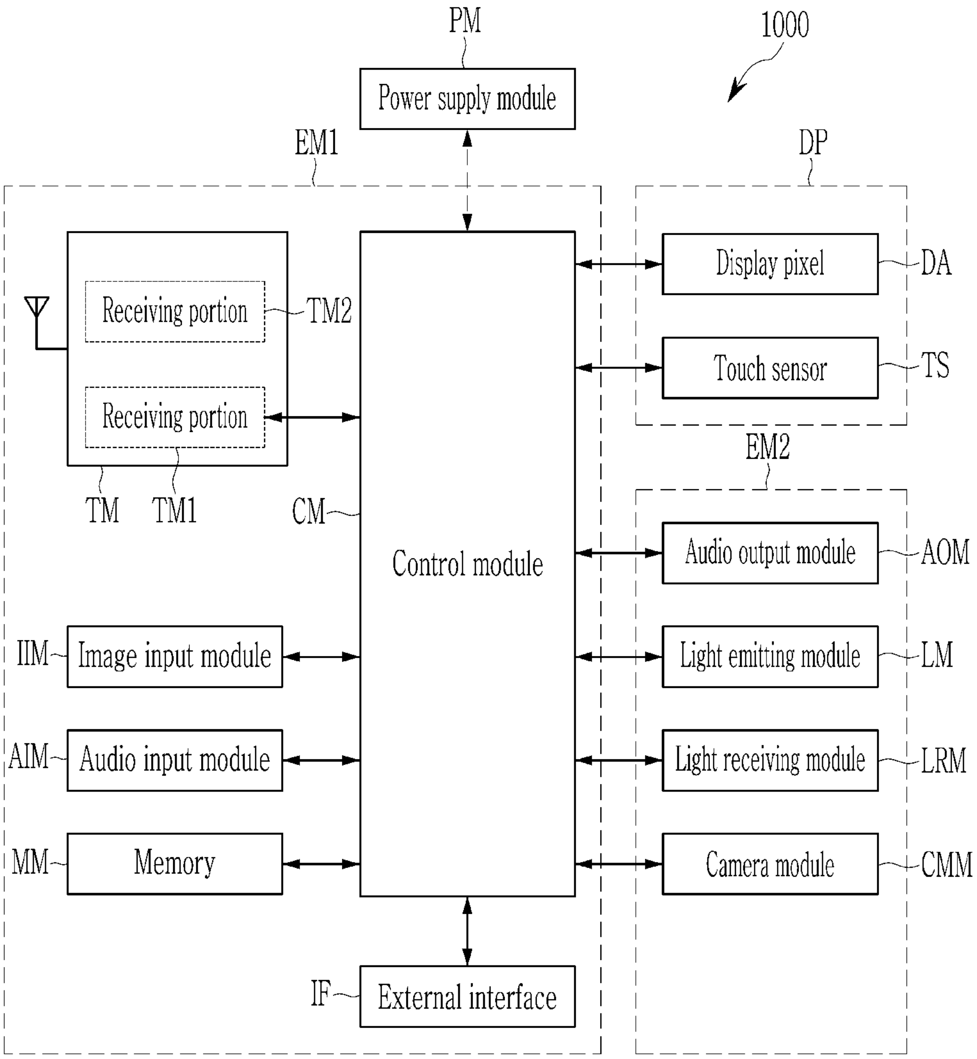
FIG. 3 is a block diagram of the display device according to the embodiment.

Hereinafter, a schematic structure of a display device will be described with reference to FIG. 1 to FIG. 3. FIG. 1 is a schematic perspective view that illustrates a use state of a display device according to an embodiment, FIG. 2 is an exploded perspective view of the display device according to the embodiment, and FIG. 3 is a block diagram of the display device according to the embodiment.

Referring to FIG. 1, a display device 1000 according to an embodiment is a device for displaying a motion picture or a still image, and may be used as a display screen of various products including not only a portable electronic device such as a mobile phone, a smart phone, a tablet personal computer ("PC"), a mobile communication terminal, an electronic notebook, an e-book, a portable multimedia player (PMP), a navigation, an ultra mobile PC ("UMPC"), and the like. In addition, the display device 1000 according to the embodiment may be used in a wearable device such as a smart watch, a watch phone, glasses display, and a head mounted display ("HMD"). In addition, the display device 1000 according to the embodiment may be used as a display of an instrument panel (substrate) of a car, a center fascia of the car or a center information display ("CID") disposed on the dashboard, a rearview mirror in place of the car's rearview a room mirror display, and a display disposed at a rear seat of the car for entertainment. FIG. 1 shows that a display device 1000 is used as a smart phone for better comprehension and ease of description.

The display device 1000 may display an image toward a third direction DR3 on a display plane that is parallel with a first direction DR1 and a second direction DR2. The display plane where an image is displayed may correspond to a front surface of the display device 1000, and may correspond to a front surface of a cover window WU. The image may include static images as well as dynamic images.

In the present embodiment, a front surface (in other words, top surface) and a rear surface (in other words, back surface) of each member are defined with reference to a direction (i.e., the third direction DR3) of displaying an image. The front surface and the bottom surface oppose each other in the third direction DR3, and a normal direction of each of the front and the rear surfaces may be parallel to the third direction DR3. A separation distance in the third direction DR3 between the front and rear surfaces may correspond to a thickness of the display panel in the third direction DR3.

The display device 1000 according to the embodiment may sense an input of a user (refer to the hand in FIG. 1) applied from the outside. The input of the user may include various types of external inputs such as a part of user's body, light, heat, or pressure. In the embodiment, the user's input is shown with the user's hand applied to the front. However, the present invention is not limited thereto. The user's input may be provided in various forms, and the display device 1000 may also sense the user's input applied to the side or rear surface of the display device 1000 according to the structure of the display device 1000.

Referring to FIG. 1 and FIG. 2, the display device 1000 may include a cover window WU, a housing HM, a display panel DP, and an optical element ES. In the embodiment, the cover window WU and the housing HM are coupled to form an external appearance of the display device 1000.

The cover window WU may include an insulation panel. For example, the cover window WU may be made of glass, plastic, or a combination thereof.

The front of the cover window WU may define a front of the display device 1000. The transmissive area TA may be an optically transparent region. For example, the transmissive area TA may be a region having a visible ray transmittance of about 90% or more.

A blocking area BA may define a shape of the transmissive area TA. The blocking area BA is adjacent to the transmissive area TA and may surround the transmissive area TA. The blocking area BA may be a region having relatively low light transmittance compared to the transmissive area TA. The blocking area BA may include an opaque material that blocks light. The blocking area BA may have a predetermined color. The blocking area BA may be defined by a bezel layer provided separately from a transparent substrate defining the transmissive area TA, or may be defined by an ink layer formed by inserting or coloring the transparent substrate.

The display panel DP may include a display area DA for displaying an image, and a data driver 50. The display panel DP may include a front surface including the display area DA and a peripheral area PA. The display area DA may be a region in which a pixel operates and emits light according to an electrical signal.

In the embodiment, the display area DA may be a region in which pixels are included and an image is displayed, and simultaneously may be a region in which a touch sensor is positioned on an upper side of the pixel in the third direction and an external input is sensed.

The transmissive area TA of the cover window WU may at least partially overlap the display area DA of the display panel DP in the plan view. For example, the transmissive area TA may overlap the front surface of the display area DA or may overlap at least a portion of the display area DA in the plan view. Accordingly, the user may recognize an image through the transmissive area TA or provide an external input based on the image. However, the present invention is not limited thereto. For example, in the display area DA, a region where an image is displayed and a region where an external input is sensed may be separated from each other.

The peripheral area PA of the display panel DP may at least partially overlap with the blocking area BA of the cover window WU in the plan view. The peripheral area PA may be a region covered by the blocking area BA. The peripheral area PA is adjacent to the display area DA and may surround the display area DA. An image is not displayed in the peripheral area PA, and a driving circuit or driving wiring for driving the display area DA may be disposed. The peripheral area PA may include a first peripheral area PA1 in which the display area DA is positioned outside, and a second peripheral area PA2 including a data driver 50, and connection wiring, and a bending region. In the embodiment of FIG. 2, the first peripheral area PA1 is disposed at three sides of the display area DA, and the second peripheral area PA2 is disposed at the rest side of the display area DA.

In the embodiment, the display panel DP may be formed by assembling the display area DA and the peripheral area PA in a flat state, facing the cover window WU. However, the present invention is not limited thereto. The peripheral area PA of the display panel DP may be partially bent. In this case, a portion of the peripheral area PA faces the rear surface of the display device 1000, and thus the blocking area BA shown on the front surface of the display device 1000 may be reduced, and in FIG. and in 2, the second peripheral area PA2 is bent, positioned on the back side of the display area DA, and then assembled.

In addition, the display panel DP may include an element area EA, and the element area EA may include a first element area EA1 and a second element area EA2. The first element area EA1 and the second element area EA2 may be at least partially surrounded by the display area DA. Although the first element area EA1 and the second element area EA2 are illustrated as being spaced apart from each other, the present invention is not limited thereto, and at least part of them may be connected in another embodiment. The first element area EA1 and the second element area EA2 may be regions in which components using infrared rays, visible ray, sound, or the like are disposed thereunder.

In the display area DA, a plurality of light emitting elements, and a plurality of pixel circuit portions that generate light emitting current and transmitting to the plurality of light emitting elements are formed. Here, one light emitting element and one pixel circuit portion are referred to as a pixel PX. In the display area DA, one pixel circuit portion and one light emitting element are formed one-to-one.

The first element area EA1 includes a region formed of a transparent layer through which light can be transmitted, and may have a structure that does not block light by including a pixel defining layer (e.g., PDL) or light blocking layer (e.g., BM), which includes a light blocking material, and defines an opening overlapping a position corresponding to the first element area EA1 in the plan view such that light is not blocked.

The second element area EA2 may include a display portion LDA that includes a transmissive portion through which light or/and sound can be transmitted, and a plurality of pixels. The transmissive portion is positioned between adjacent pixels and is formed of a transparent layer through which light and/or sound can pass. The display portion LDA may have one unit structure by adding a plurality of pixels, and a transmissive portion may be positioned between adjacent unit structures. The second element area EA2 will be described in detail with reference to FIG. 10A and FIG. 10B.

Referring to FIG. 3 together with FIG. 1 and FIG. 2, the display panel DP may include the display area DA where a display pixel is included, and a touch sensor TS. The display panel DP includes pixels that creates an image, and thus may be visually recognized by the user from the outside through the transmissive area TA. In addition, the touch sensor TS may be positioned on an upper portion of the pixel, and may sense an external input applied from the outside. The touch sensor TS may sense an external input provided to the cover window WU.

Referring back to FIG. 2, the second peripheral area PA2 may include a bending portion. The display area DA and the first peripheral area PA1 may have a flat state while substantially being parallel with a plane that is defined by the first direction DR1 and the second direction DR2, and one side of the second peripheral area PA2 may extend from a flat state and have a flat state again after going through a bending part. As a result, at least a part of the second peripheral area PA2 may be bent and assembled to be positioned on the rear side of the display area DA. At least a part of the second peripheral area PA2 overlaps the display area DA on a plane when being assembled, and thus the blocking area BA of the display device 1000 may be reduced. However, the present invention is not limited thereto. For example, the second peripheral area PA2 may not be bent in another embodiment.

The data driver 50 may be mounted on the second peripheral area PA2, and may be mounted on the bending portion or positioned at one of both sides of the bending portion. The data driver 50 may be provided in the form of a chip.

The data driver 50 may be electrically connected to the display area DA to transmit an electrical signal to the display area DA. For example, the data driver 50 may provide data signals to pixels PX disposed to the display area DA. Alternatively, the data driver 50 may include a touch driving circuit and may be electrically connected to the touch sensor TS disposed in the display area DA. Meanwhile, the data driver 50 may include various circuits in addition to the above-described circuits or may be designed to provide various electrical signals to the display area DA.

The display device 1000 may have a pad portion positioned at an end of the second peripheral area PA2, and may be electrically connected to a flexible printed circuit board ("FPCB") including a driving chip by the pad portion. Here, the driving chip positioned on the flexible printed circuit board may include various driving circuits for driving the display device 1000 or connectors for power supply. Depending on embodiments, a rigid printed circuit board ("PCB") may be used instead of a flexible printed circuit substrate.

The optical element ES may be disposed under the display panel DP. The optical element ES may include a first optical element ES1 overlapping the first element area EA1 and a second optical element ES2 overlapping the second element area EA2 in the plan view.

The first optical element ES1 may be an electronic element using light or sound. For example, the first optical element ES1 is a sensor that receives and uses light like an infrared sensor, a sensor that outputs and senses light or sound to measure a distance or recognizes a fingerprint, a small lamp that outputs light, or a speaker that outputs a sound. In the case of an electronic element using light, light of various wavelength bands such as visible light, infrared light, and ultraviolet ray light can be used.

The second optical element ES2 may be at least one of a camera, an infrared ("IR") camera, a dot projector, an infrared illuminator, and a time-of-flight ("ToF") sensor.

Referring to FIG. 3, the display device 1000 may include the display panel DP, a power supply module PM, a first electronic module EM1, and a second electronic module EM2. The display panel DP, the power supply module PM, the first electronic module EM1, and the second electronic module EM2 may be electrically connected to each other. In FIG. 3, among the configuration of the display panel DP, the display pixel and the touch sensor TS positioned in the display area DA are shown as an example.

The power supply module PM may supply power required for the overall operation of the display device 1000. The power supply module PM may include a conventional battery module.

The first electronic module EM1 and the second electronic module EM2 may include various functional modules for operating the display device 1000. The first electronic module EM1 may be directly mounted on the motherboard electrically connected to the display panel DP or mounted on a separate substrate and electrically connected to the motherboard through a connector (not shown).

The first electronic module EM1 may include a control module CM, a wireless communication module TM, an image input module IIM, an audio input module AIM, a memory MM, and an external interface IF. Some of the modules are not mounted on the motherboard, but may be electrically connected to the motherboard through the flexible printed circuit board connected thereto.

The control module CM may control the overall operation of the display device 1000. The control module CM may be a microprocessor. For example, the control module CM activates or deactivates the display panel DP. The control module CM may control other modules such as the image input module IIM or the audio input module AIM based on the touch signal received from the display panel DP.

The wireless communication module TM may transmit/receive a wireless signal with another terminal using a Bluetooth or Wi-Fi line. The wireless communication module TM may transmit/receive voice signals using a general communication line. The wireless communication module TM includes a transmitting portion TM1 that modulates and transmits a signal to be transmitted, and a receiving portion TM2 that demodulates a received signal.

The image input module IIM may process the image signal and convert the processed image signal into image data that can be displayed on the display panel DP.

The audio input module AIM may receive an external sound signal input by a microphone in a recording mode, a voice recognition mode, and the like and convert it into electrical voice data.

The external interface IF may serve as an interface connected to an external charger, a wired/wireless data port, a card socket (e.g., a memory card, a SIM/UIM card), and the like.

The second electronic module EM2 may include an audio output module AOM, a light emitting module LM, a light receiving module LRM, a camera module CMM, and the like, and at least a part of these modules may be positioned at a rear side of the display panel DP as an optical element ES as shown in FIG. 1 and FIG. 2. As the optical element ES, a light emitting module LM, a light receiving module LRM, and a camera module CMM may be included. In addition, the second electronic module EM2 may be directly mounted on a mother board, or may be mounted to an additional substrate and thus be electrically connected with the display panel DP through a connector (not shown), or may be electrically connected with the first electronic module EM1.

The audio output module AOM may convert audio data received from the wireless communication module TM or audio data stored in the memory MM and outputs the converted audio data to the outside.

The light emitting module LM may generate and output light. The light emitting module LM may output infrared light. For example, the light emitting module LM may include an LED element. For example, the light receiving module LRM may sense infrared light. The light receiving module LRM may be activated when infrared light above a predetermined level is detected. The light receiving module LRM may include a CMOS sensor. After the infrared light generated by the light emitting module LM is output, the light is reflected by an external subject (e.g., a user's finger or face), and the reflected infrared light can be incident on the light receiving module LRM. The camera module CMM may take an external image.

In the embodiment, the optical element ES may additionally include a photosensitive sensor or a thermal sensor. The optical element ES may detect an external object received through the front surface or may provide a sound signal such as voice through the front surface to the outside. In addition, the optical element ES may include a plurality of configurations, and is not limited to any one embodiment.

Referring back to FIG. 2, the housing HM may be combined with the cover window WU. The cover window WU may be disposed in front of the housing HM. The housing HM may be combined with the cover window WU to provide a predetermined accommodation space. The display panel DP and the optical element ES may be accommodated in a predetermined receiving space provided between the housing HM and the cover window WU.

The housing HM may contain a material with relatively high stiffness. For example, the housing HM may include a plurality of frames and/or plates made of glass, plastic, or metal, or a combination thereof. The housing HM may reliably protect the components of the display device 1000 accommodated in the interior space from external impact.

Figure 4:
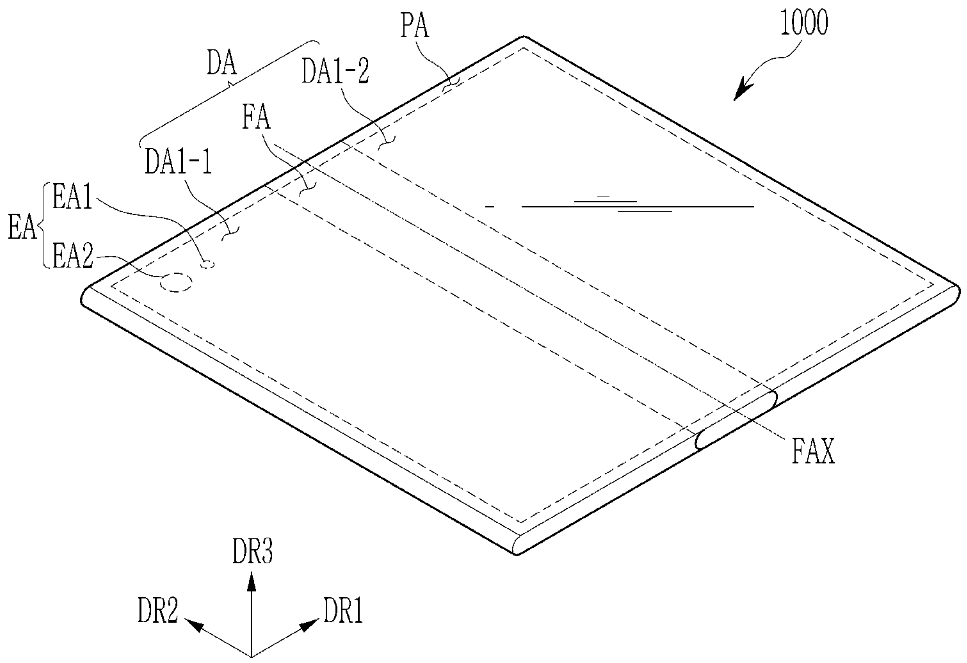
FIG. 4 is a schematic perspective view of a display device according to another embodiment.

Hereinafter, referring to FIG. 4, a structure of a display device 1000 according to another embodiment will be described. FIG. 4 is a schematic perspective view of a display device according to another embodiment. A description of the above-described constituent element and the same configuration will be omitted.

In the embodiment of FIG. 4, a foldable display device with a structure in which the display device 1000 is folded along a folding line FAX is illustrated.

Referring to FIG. 4, in the present embodiment, the display device 1000 may be a foldable display device. The display device 1000 may be folded outwardly or inwardly based on the folding axis FAX. When folded outward based on the folding axis FAX, the display surface of the display device 1000 is positioned on the outside in the third direction DR3, and thus images can be displayed in both directions. When folded inward based on the folding axis FAX, the display surface may not be visually recognized from the outside.

In the embodiment, the display device 1000 may include a display area DA, an element area EA, and a peripheral area PA. The display area DA may be divided into a 1-1 display area DA1-1, a 1-2 display area DA1-2, and a folding area FA. The 1-1 display area DA1-1 and the 1-2 display area DA1-2 may be positioned on the left and right sides, respectively, based on (or at the center) of the folding axis FAX, and the folding area FA may be disposed between the 1-1 display area DA1-1 and the 1-2 display area DA1-2. In this case, when folded outward based on the folding axis FAX, the 1-1 display area DA1-1 and the 1-2 display area DA1-2 are positioned on both sides in the third direction DR3, and images can be displayed in both directions. In addition, when folded inward based on the folding axis FAX, the 1-1 display area DA1-1 and the 1-2 display area DA1-2 may not be visually recognized from the outside.

Figure 5:
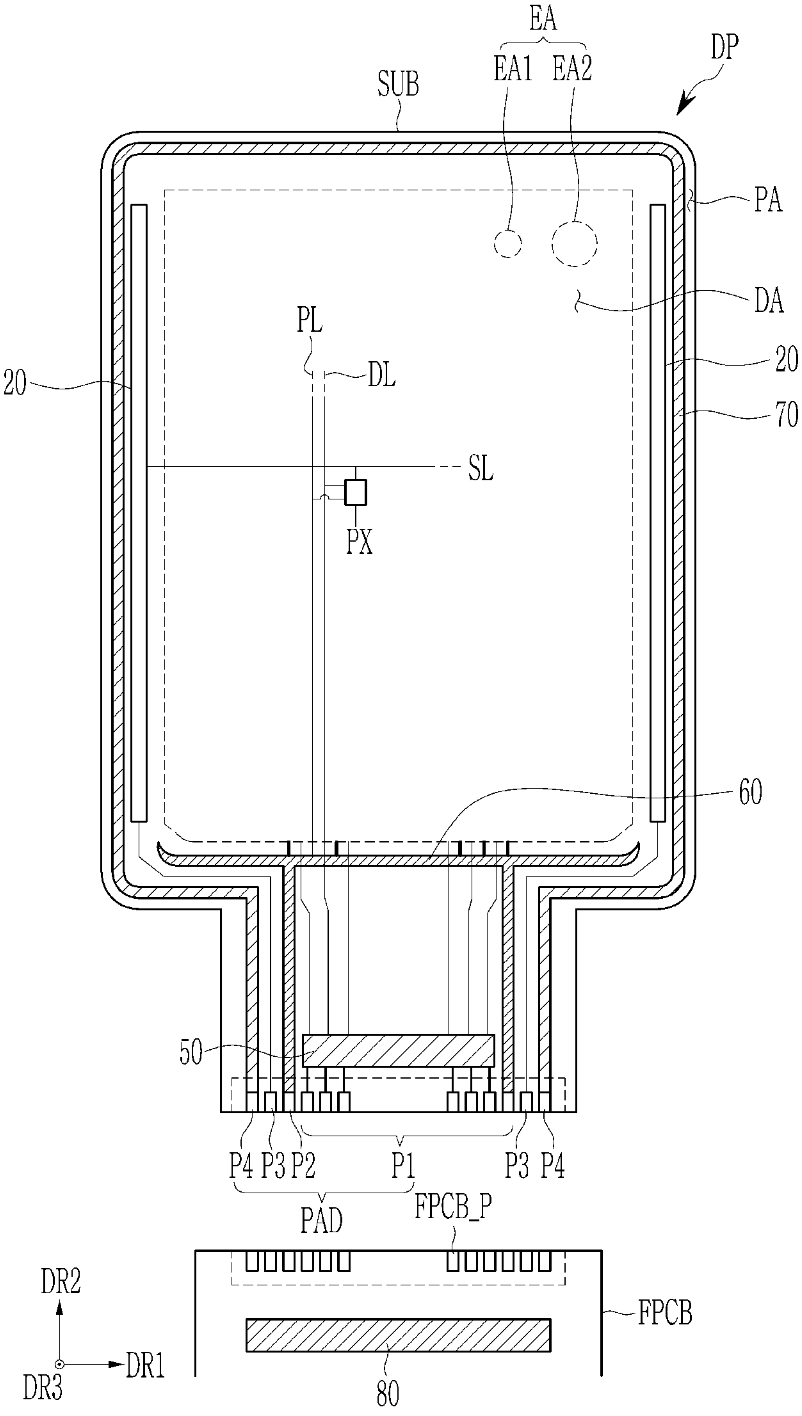
FIG. 5 is a top plan view of some constituent elements of the display panel according to the embodiment.

Hereinafter, a structure of the display panel DP will be described in detail with reference to FIG. 5. FIG. 5 is a top plan view of some constituent elements of the display panel according to the embodiment.

Referring to FIG. 5, the display panel DP may include a display area DA, an element area EA, and a peripheral area PA, and the peripheral area PA may be defined along an edge of the display area DA.

The display panel DP includes a plurality of pixels PX. The plurality of pixels PX may be disposed in the display area DA. Each pixel PX includes a light emitting element (e.g., a light emitting diode ED) and a pixel circuit portion connected thereto. Each pixel PX emits light of for example, red, green, and blue, or white, and may include, for example, an organic light emitting diode.

The display panel DP may include a plurality of signal lines and a pad portion. The plurality of signal lines may include a scan line SL extending in a first direction DR1, and a data line DL and a driving voltage line PL extending in a second direction DR2.

The scan driver 20 is positioned on the left and right of the display area DA, and generates and transmits a scan signal to each pixel PX through the scan line SL. The pixel PX may receive scan signals from two scan drivers 20 positioned on the left and right sides.

A pad portion PAD (hereinafter, also referred to as a pad portion for a circuit board) is disposed at one end of the peripheral area PA, and may include a plurality of terminals P1, P2, P3, and P4. The pad portion PAD may be exposed without being covered by an insulating layer to be electrically connected to a flexible printed circuit board FPCB. The pad portion PAD may be electrically connected to a pad portion FPCB_P of the flexible printed circuit board FPCB. The flexible printed circuit board FPCB may transmit a signal or power of an IC driving chip 80 to the pad portion PAD.

The IC driving chip 80 converts a plurality of image signals transmitted from the outside into a plurality of image data signals, and transmits the changed signal to the data driver 50 through the terminal P1. In addition, the IC driving chip 80 receives a vertical synchronization signal, a horizontal synchronizing signal, and a clock signal, generates a control signal to control the operation of the scan driver 20 and the data driver 50, and transmits the control signal to each of the scan driver 20 and the data driver 50 through the terminals P3 and P1. The IC driving chip 80 transmits a driving voltage ELVDD to a driving voltage supply wiring 60 through the terminal P2. In addition, the IC driving chip 80 may deliver a common voltage ELVSS to each of the common voltage supply wirings 70 through the terminal P4.

The data driver 50 is disposed on the peripheral area PA, generates a data voltage DATA to be applied to each pixel PX, and transmits the data voltage to each data line DL. The data driver 50 may be disposed at one side of the display panel DP, and for example, may be disposed between the pad portion PAD and the display area DA. Referring to FIG. 5, a data line L connected to pixels PX excluding pixels disposed above and below the element area EA along the second direction DR2 may have a structure of a straight line that extends along the second direction DR2. On the contrary, a data line DL connected to pixels PX disposed above and below the element area EA extends along the second direction DR2, but may include a portion extending along the periphery of the element area EA at the periphery of the element area EA.

The driving voltage supply wiring 60 is disposed on the peripheral area PA. For example, the driving voltage supply wiring 60 may be disposed between the data driver 50 and the display area DA. The driving voltage supply wiring 60 provides a driving voltage ELVDD to the pixel PX. The driving voltage supply wiring 60 is aligned in the first direction DR1, and may be connected with a plurality of driving voltage lines PL arranged in the second direction DR2.

The common voltage supply wiring 70 is disposed on the peripheral area PA. The common voltage supply wiring 70 may have a shape that surrounds a substrate SUB. The common voltage supply wiring 70 transmits a common voltage ELVSS to an electrode (e.g., a cathode) of a light emitting element included in the pixel PX.

Figure 6:
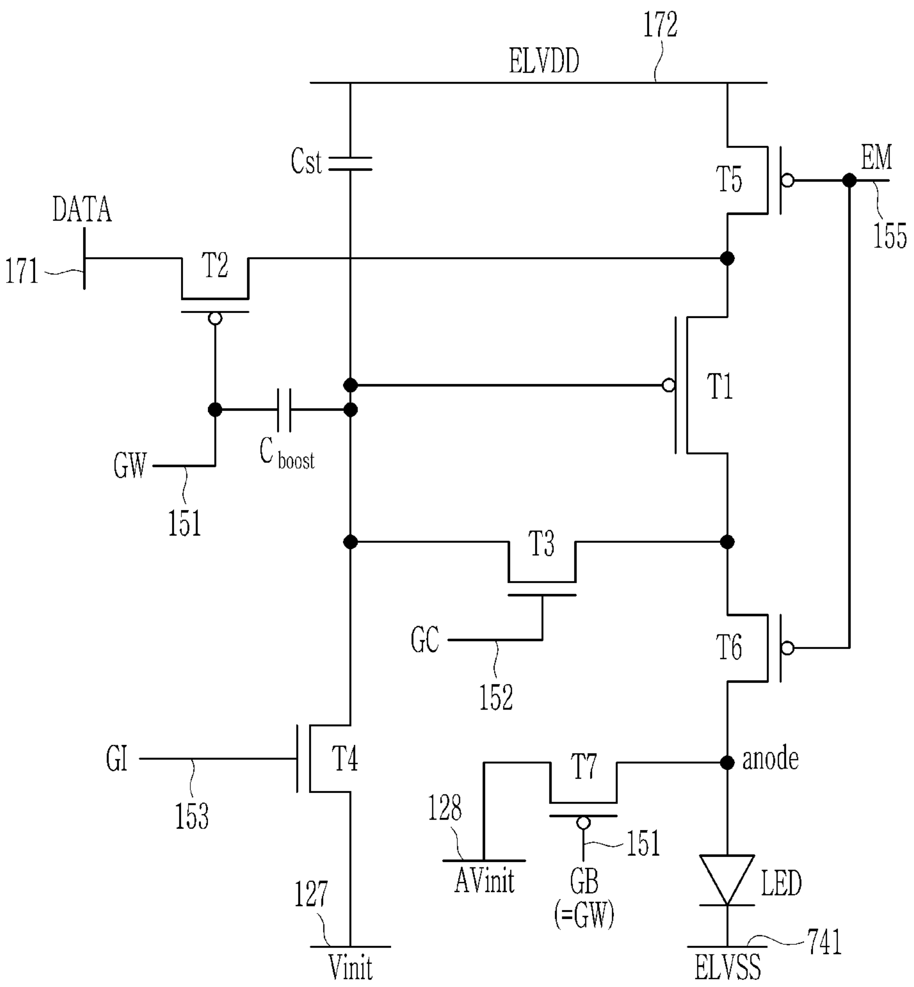
FIG. 6 is a circuit diagram of a pixel included in the display panel according to the embodiment.

An example of a circuit structure of the pixel PX positioned on the display panel DP as described above will be described with reference to FIG. 6. FIG. 6 is a circuit diagram of a pixel included in the display panel according to the embodiment.

The circuit structure shown in FIG. 6 is a circuit structure of a pixel circuit portion and a light emitting element disposed in the display area DA and a part of the element area EA.

A pixel according to the embodiment includes a plurality of transistors T1, T2, T3, T4, T5, T6, and T7 connected to a plurality of wires 127, 128, 151, 152, 153, 155, 171, 172, and 741, a storage capacitor Cst, a boost capacitor $C_{boost}$, and a light emitting diode ED. Here, the transistors and the capacitor, excluding the light emitting diode ED, form a pixel circuit portion. Depending on embodiments, the boost capacitor $C_{boost}$ can be omitted.

A plurality of wires 127, 128, 151, 152, 153, 155, 171, 172, and 741 are connected to one pixel PX. The plurality of wires includes a first initialization voltage line 127, a second initialization voltage line 128, a first scan line 151, a second scan line 152, an initialization control line 153, a light emission control line 155, a data line 171, a driving voltage line 172, and a common voltage line 741. In an embodiment of FIG. 7, the first scan line 151 connected with the seventh transistor T7 is also connected with the second transistor T2, but, depending on embodiments, unlike the second transistor T2, the seventh transistor T7 may be connected through a separate bypass control line.

The first scan line 151 is connected to a scan driver (not shown) and transmits a first scan signal GW to the second transistor T2 and the seventh transistor T7. The second scan line 152 may be applied with a voltage of opposite polarity to a voltage applied to the first scan line 151 at the same timing as the signal of the first scan line 151. For example, when a negative voltage is applied to the first scan line 151, a positive voltage may be applied to the second scan line 152. The second scan line 152 transmits the second scan signal GC to the third transistor T3. The initialization control line 153 transmits an initialization control signal GI to the fourth transistor T4. The light emission control line 155 transmits the light emission control signal EM to the fifth transistor T5 and the sixth transistor T6.

The data line 171 is a wire that transmits a data voltage DATA generated by a data driver (not shown), and accordingly, intensity of a light emitting current transmitted to the light emitting diode ED changes and thus the luminance of the light emitting diode ED also changes. The driving voltage line 172 applies the driving voltage ELVDD. The first initialization voltage line 127 transmits a first initialization voltage Vinit, and the second initialization voltage line 128 transmits a second initialization voltage AVinit. The common voltage line 741 applies the common voltage ELVSS to a cathode of the light emitting diode LED. In the present embodiment, voltages applied to the driving voltage line 172, the first and second initialization voltage line 127 and 128, and the common voltage line 741 may be constant voltages, respectively.

The driving transistor T1 (also called a first transistor) is a p-type transistor, and has a silicon semiconductor as a semiconductor layer. The driving transistor T1 is a transistor that adjusts intensity of a light emission current output to an anode of the light emitting diode LED according to the magnitude of a voltage (i.e., a voltage stored in the storage capacitor Cst) of a gate electrode of the driving transistor T1. Since brightness of the light emitting diode LED is adjusted according to the intensity of a light emission current output to the anode of the light emitting diode LED, luminance of the light emitting diode LED can be adjusted according to a data voltage DATA applied to the pixel. For this purpose, a first electrode of the driving transistor T1 is disposed to be applied with the fifth transistor T5. In addition, the first electrode of the driving transistor T1 is also connected with a second electrode of the second transistor T2 and is thus applied with the data voltage DATA. A second electrode of the driving transistor T1 outputs a light emitting current to the light emitting diode LED and thus is connected with the anode of the light emitting diode LED via the sixth transistor T6 (hereinafter, also referred to as an output control transistor). In addition, the second electrode of the driving transistor T1 is also connected with the third transistor T3, and thus transmits the data voltage DATA applied to the first electrode to the third transistor T3. The gate electrode of the driving transistor T1 is connected with one electrode (hereinafter, referred to as a second storage electrode) of the storage capacitor Cst. Thus, a voltage of the gate electrode of the driving transistor T1 is changed according to the voltage stored in the storage capacitor Cst, and accordingly, the light emitting current output from the driving transistor T1 is changed. The storage capacitor Cst serves to maintain the voltage of the gate electrode of the driving transistor T1 to be constant for one frame. The gate electrode of the driving transistor T1 is also connected with the third transistor T3 and thus the data voltage DATA applied to the first electrode of the driving transistor T1 may be transmitted to the gate electrode of the driving transistor T1 through the third transistor T3. The gate electrode of the driving transistor T1 is also connected to the fourth transistor T4 and may be initialized by receiving the first initialization voltage Vinit.

The second transistor T2 is a p-type transistor and has a silicon semiconductor as a semiconductor layer. The second transistor T2 is a transistor that receives the data voltage DATA into the pixel. A gate electrode of the second transistor T2 is connected with the first scan line 151 and one electrode (hereinafter, referred to as a lower boost electrode) of the boost capacitor $C_{boost}$. A first electrode of the second transistor T2 is connected with the data line 171. A second electrode of the second transistor T2 is connected with the first electrode of the driving transistor T1. When the second transistor T2 is turned on by a negative voltage of the first scan signal GW transmitted through the first scan line 151, and the data voltage DATA transmitted through the data line 171 is transmitted to the first electrode of the driving transistor T1, and is then transmitted to the gate electrode of the driving transistor T1 and finally stored in the storage capacitor Cst.

The third transistor T3 is an n-type transistor and has an oxide semiconductor as a semiconductor layer. The third transistor T3 is electrically connected to the second electrode of the driving transistor T1 and the gate electrode of the driving transistor T1. As a result, the data voltage DATA is compensated by a threshold voltage of the driving transistor T1 and then stored in the second storage electrode of the storage capacitor Cst by the third transistor T3. A gate electrode of the third transistor T3 is connected to the second scan line 152, and a first electrode of the third transistor T3 is connected to the second electrode of the driving transistor T1. A second electrode of the third transistor T3 is connected with a second storage electrode of the storage capacitor Cst, the gate electrode of the driving transistor T1, and the other electrode (hereinafter, referred to as an upper boost electrode) of the boost capacitor $C_{boost}$. The third transistor T3 is turned on by a voltage of the positive voltage of the second scan signal GC transmitted through the second scan line 152, and thus connects the gate electrode of the driving transistor T1 and the second electrode of the driving transistor T1, and transmits the voltage applied to the gate electrode of the driving transistor T1 to store the voltage in the storage capacitor Cst. In this case, the voltage stored in the storage capacitor Cst is a voltage of the gate electrode of the driving transistor T1 when the driving transistor T1 is turned off, and thus is stored in a state that a threshold voltage Vth of the driving transistor T1 is compensated.

The fourth transistor T4 is an n-type transistor and has an oxide semiconductor as a semiconductor layer. The fourth transistor T4 initializes the gate electrode of the driving transistor T1 and the second storage electrode of the storage capacitor Cst. The gate electrode of the fourth transistor T4 is connected to the initialization control line 153, and the first electrode of the fourth transistor T4 is connected to the first initialization voltage line 127. The second electrode of the fourth transistor T4 is connected to the second electrode of the third transistor T3, the second storage electrode of the storage capacitor Cst, the gate electrode of the driving transistor T1, and the upper boost electrode of the boost capacitor $C_{boost}$. The fourth transistor T4 is turned on by the positive voltage of the initialization control signal GI received through the initialization control line 153, and in this case, the first initialization voltage Vinit is applied to the gate electrode of the driving transistor T1, the second storage electrode of the storage capacitor Cst, and the upper boost electrode of the boost capacitor $C_{boost}$ for initialization.

The fifth transistor T5 and the sixth transistor T6 are p-type transistors and have silicon semiconductors as semiconductor layers.

The fifth transistor T5 serves to transmit the driving voltage ELVDD to the driving transistor T1. The gate electrode of the fifth transistor T5 is connected to the light emission control line 155, the first electrode of the fifth transistor T5 is connected to the driving voltage line 172, and the second electrode of the fifth transistor T5 is connected to the first electrode of the driving transistor T1.

The sixth transistor T6 serves to transmit the light emitting current output from the driving transistor T1 to the light emitting diode LED. A gate electrode of the sixth transistor T6 is connected to the light emission control line 155, a first electrode of the sixth transistor T6 is connected to the second electrode of the driving transistor T1, and a second electrode of the sixth transistor T6 is connected to the anode of the light emitting diode LED.

The seventh transistor T7 is a p-type or n-type transistor, and has a silicon semiconductor or oxide semiconductor as a semiconductor layer. The seventh transistor T7 initializes the anode of the light emitting diode LED. A gate electrode of seventh transistor T7 is connected to the first scan line 151, a first electrode of seventh transistor T7 is connected to the anode of light emitting diode LED, and a second electrode of seventh transistor T7 is connected to second initialization voltage line 128. When the seventh transistor T7 is turned on by the negative voltage of the first scan line 151, the second initialization voltage AVinit is applied to the anode of the light emitting diode LED and initialized. The gate electrode of the seventh transistor T7 is connected to a separate bypass control line and can be controlled by separate wiring from the first scan line 151. In addition, depending on embodiments, the second initialization voltage line 128 to which the second initialization voltage AVinit is applied may be the same as the first initialization voltage line 127 to which the first initialization voltage Vinit is applied.

It has been described that one pixel PX includes seven transistors T1 to T7, two capacitors (storage capacitor Cst and boost capacitor $C_{boost}$), but this is not restrictive, and depending on embodiments, the boost capacitor $C_{boost}$ may be excluded. In addition, the third transistor and the fourth transistor are provided as the n-type transistors in the above-described embodiment, but only one of the third and fourth transistors may be provided as the n-type transistor or the other may be provided as the n-type transistor. In addition, according to another embodiment, the seven transistors may all be changed to p-type transistors or no-type transistors.

Figure 7:
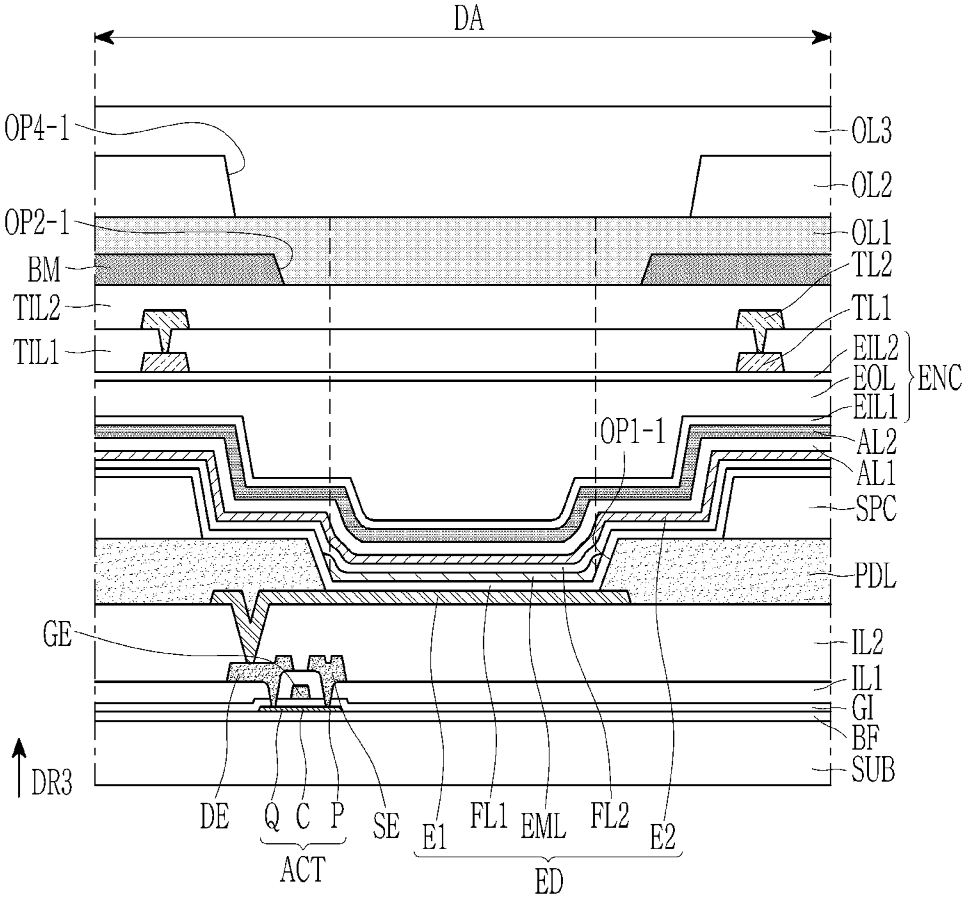
FIG. 7 is a cross-sectional view of configurations arranged in the display area.
Figure 8:
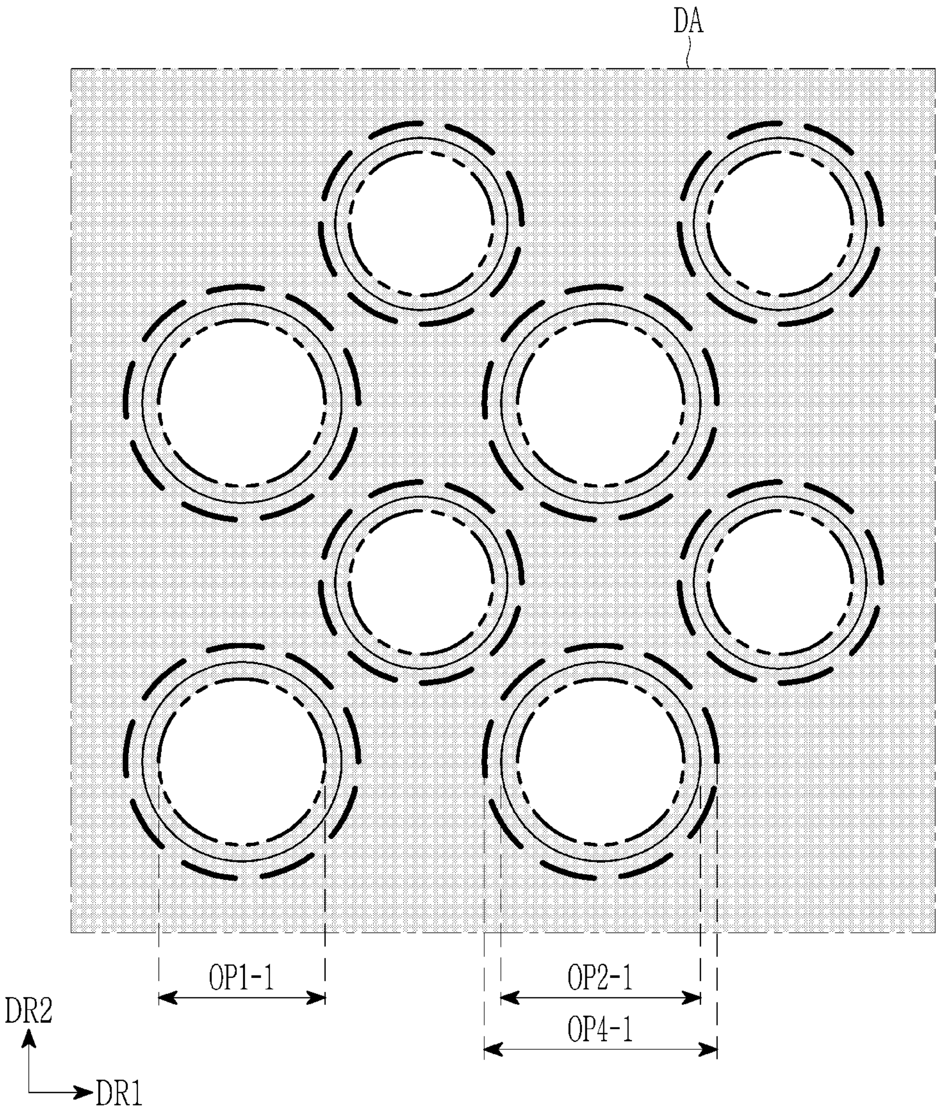
FIG. 8 is a top plan view of some configurations of the display area according to the embodiment.

Hereinafter, referring to FIG. 7 and FIG. 8, a stacked structure of the display area DA will be described. FIG. 7 is a cross-sectional view of configurations arranged in the display area DA, and FIG. 8 is a top plan view of some configurations of the display area DA according to the embodiment.

Referring to FIG. 7, the display panel according to the embodiment includes a substrate SUB. The substrate SUB may include an inorganic insulating material such as glass or an organic insulating material such as plastic such as polyimide ("PI"). The substrate SUB may be single-layered or multi-layered. The substrate SUB may have a structure in which at least one base layer containing a sequentially stacked polymer resin and at least one inorganic layer are alternately stacked.

The substrate SUB may have various degrees of flexibility. The substrate SUB may be a rigid substrate or a flexible substrate capable of bending, folding, rolling, and the like.

A buffer layer BF may be positioned on the substrate SUB. The buffer layer BF blocks transmission of impurities from the substrate SUB to an upper layer of the buffer layer BF, particularly a semiconductor layer ACT, thereby preventing characteristic degradation of the semiconductor layer ACT and reducing stress. The buffer layer BF may include an inorganic insulating material or an organic insulating material such as a silicon nitride or a silicon oxide. A part or all of the buffer layer BF may be omitted.

The semiconductor layer ACT is positioned on the buffer layer BF. The semiconductor layer ACT may include at least one of polysilicon and an oxide semiconductor. The semiconductor layer ACT includes a channel region C, a first region P, and a second region Q. The first region P and the second region Q are respectively disposed on both sides of the channel region C. The channel region C may include a semiconductor doped with a small amount of an impurity or undoped with an impurity, and the first region P and the second region Q may include a semiconductor doped with a large amount of an impurity compared to the channel region C. The semiconductor layer ACT may be formed of or include an oxide semiconductor, and in this case, a separate protective layer (not shown) may be added to protect the oxide semiconductor material, which is vulnerable to external environments such as a high temperature.

A gate insulating layer GI is positioned on the semiconductor layer ACT. The gate insulating layer GI may be a single-layer or a multi-layer including at least one of a silicon oxide ($S_iO_x$), a silicon nitride ($S_iN_x$), and a silicon oxynitride ($S_iO_xN_y$).

A gate electrode GE is positioned on the gate insulating layer GI. The gate electrode GE may be a single layer or a multilayer in which a metal film including any one of copper (Cu), a copper alloy, aluminum (Al), an aluminum alloy, molybdenum (Mo), a molybdenum alloy, titanium (Ti), and a titanium alloy is laminated. The gate electrode GE may overlap the channel region C of the semiconductor layer ACT in the plan view.

A first insulating layer IL1 is positioned on the gate electrode GE and the gate insulating layer GI. The first insulating layer IL1 may be a single-layer or a multi-layer including at least one of a silicon oxide (SOX), a silicon nitride ($S_iN_x$), and a silicon oxynitride ($S_iO_xN_y$).

A source electrode SE and a drain electrode DE are positioned on the first insulating layer Ill. The source electrode SE and the drain electrode DE are respectively connected to the first region P and the second region Q of the semiconductor layer ACT through a contact hole formed in the first insulating layer ILL The source electrode SE and the drain electrode DE may include aluminum (Al), silver (Ag), magnesium (Mg), gold (Au), nickel (Ni), chromium (Cr), nickel (Ni), calcium (Ca), molybdenum (Mo), titanium (Ti), tungsten (W), and/or copper (Cu), and may have a single-layer or multi-layered structure including the same.

A second insulating layer IL2 is positioned on the first insulating layer ILL the source electrode SE, and the drain electrode DE. The second insulating layer IL2 may include an organic insulating material such as general-purpose polymers such as polymethyl methacrylate ("PMMA") or polystyrene ("PS"), polymer derivatives with phenolic groups, acryl-based polymers, imide-based polymers, polyimide, acryl-based polymers, siloxane-based polymers, and the like. In the present specification, the second insulating layer IL2 is illustrated as a single layer, but this is not restrictive, and it may be multi-layered.

The first electrode E1 is positioned on the second insulating layer IL2. The first electrode E1 is electrically connected to the drain electrode DE through a contact hole of the second insulating layer IL2.

The first electrode E1 may include a metal such as silver (Ag), lithium (Li), calcium (Ca), aluminum (Al), magnesium (Mg), or gold (Au), and may also include a transparent conductive oxide ("TCO") such as an indium tin oxide ("ITO"), an indium zinc oxide ("IZO"), and the like. The first electrode E1 may be formed of a single layer including a metal material or a transparent conductive oxide, or a multilayer including the same. For example, the first electrode E1 may have a triple layer structure of indium tin oxide (ITO)/silver (Ag)/indium tin oxide (ITO).

A transistor formed of a gate electrode GE, a semiconductor layer ACT, a source electrode SE, and a drain electrode DE is connected to the first electrode E1 to supply a current to the light emitting diode.

The pixel defining layer PDL is positioned on the second insulating layer IL2 and the first electrode E1.

The pixel defining layer PDL defines a 1-1 opening OP1-1 that overlaps at least a part of the first electrode E1 in the plan view and defines the light emitting region. The 1-1 opening OP1-1 may have a planar shape almost similar to a planar shape of the first electrode E1. As shown in FIG. 8, the 1-1 opening OP1-1 is illustrated in a circular shape on a plane, but it is not limited thereto, and may have any shape such as an octagonal shape similar to a rhombus or an octagonal shape similar to a rhombus, a quadrangle, a polygon, or an oval in another embodiment.

The pixel defining layer PDL may contain an organic insulator. Alternatively, the pixel defining layer PDL may include an inorganic insulating material such as a silicon nitride, a silicon oxynitride, or a silicon oxide. Alternatively, the pixel defining layer PDL may include an organic insulator and an inorganic insulator. In the embodiment, the pixel defining layer PDL contains a light blocking material and may be provided in black. The light blocking material is carbon black, carbon nanotubes, a resin containing a black dye, or a paste, metal particles, for example, nickel, aluminum, molybdenum, and alloys thereof, metal oxide particles (e.g., a chromium oxide), or metal nitride particles (e.g., chromium nitride), and the like. When the pixel defining layer PDL includes a light blocking material, it is possible to reduce the reflection of external light by the metal structures disposed under the pixel defining layer PDL. However, the present invention is not limited thereto. In another embodiment, the pixel defining layer PDL does not contain a light-blocking material, but may contain a light-transmitting organic insulator.

A spacer SPC may be disposed on the pixel defining layer PDL. The spacer SPC may contain an organic insulator such as polyimide. Alternatively, the spacer SPC may include an inorganic insulator such as a silicon nitride (SiNx) or a silicon oxide ($SiO_2$), or may include an organic insulator and an inorganic insulator.

In the embodiment, the spacer SPC may contain the same material as the pixel defining layer PDL. In this case, the pixel defining layer PDL and the spacer SPC may be formed together in a mask process using a halftone mask or the like. In the embodiment, the pixel defining layer PDL and spacer SPC may contain different materials.

An emission layer EML is positioned on the first electrode E1. The emission layer EML may contain organic and/or inorganic materials. The emission layer EML may generate light of a predetermined color. The emission layer EML may be positioned only within the 1-1 opening OP1-1 of the pixel defining layer using a mask or inkjet process.

A first functional layer FL1 may be positioned between the emission layer EML and the first electrode E1, and a second functional layer FL2 may be positioned between the emission layer EML and the second electrode E2.

The first functional layer FL1 may include at least one of a hole injection layer ("HIL") and a hole transporting layer (HTL), and the second functional layer FL2 may include at least one of an electron transporting layer ("ETL") and an electron injection layer ("EIL").

While the emission layer EML is disposed for each pixel to correspond to the opening OP1-1 of the pixel defining layer PDL, the first functional layer FL1 and the second functional layer FL2 can be integrally formed to wholly cover the substrate SUB. In other words, the first functional layer FL1 and the second functional layer FL2 may be integrally formed to completely cover the display area DA of the substrate SUB, respectively.

The second electrode E2 is positioned on the emission layer EML. The second electrode E2 may include a reflective metal including calcium (Ca), barium (Ba), magnesium (Mg), aluminum (Al), silver (Ag), gold (Au), nickel (Ni), chromium (Cr), lithium (Li), molybdenum (Mo), or the like, or a transparent conductive oxide (TCO) such as an indium tin oxide (ITO) or an indium zinc oxide (IZO).

The first electrode E1, the emission layer EML, and the second electrode E2 may form a light emitting diode ED. Here, the first electrode E1 may be an anode that is a hole injection electrode, and the second electrode E2 may be a cathode that is an electron injection electrode. However, the embodiment is not limited thereto, and depending on the driving method of the light emitting display device, the first electrode E1 may be a cathode and the second electrode E2 may be an anode.

Holes and electrons are injected into the emission layer EML from the first electrode E1 and the second electrode E2, and light emission occurs when an exciton, where the injected hole and electron are combined, falls from an excited state to a ground state.

A capping layer AL1 may be positioned on the second electrode E2. The capping layer AL1 may serve to improve the luminous efficiency of the light emitting diode ED by the principle of constructive interference. The capping layer AL1 may include, for example, a material having a refractive index of 1.6 or more for light having a wavelength of 589 nanometers (nm).

The capping layer AL1 may be an organic capping layer including an organic material, an inorganic capping layer including an inorganic material, or a composite capping layer including an organic material and an inorganic material. For example, the capping layer AL1 may include a carbocyclic compound, a heterocyclic compound, an amine group-containing compound, a porphine derivative, a phthalocyanine derivative, a naphthalocyanine derivative, an alkali metal complex, alkaline earth metal complexes, or any combination thereof. The carbocyclic compounds, the heterocyclic compounds, and the amine group-containing compounds may be optionally substituted with substituents including O, N, S, Se, Si, F, Cl, Br, I, or any combination thereof.

A low reflective layer AL2 may be disposed on the capping layer AL1. Since the capping layer AL1 may be disposed on the light emitting diode ED, a low reflective layer AL2 may be disposed on the light emitting diode ED. The low reflective layer AL2 may overlap a front surface of the substrate SUB in the plan view.

The low reflective layer AL2 may include an inorganic material having low reflectance, and in an embodiment, it may include a metal or metal oxide. When the low reflective layer AL2 contains a metal, it may include, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), and it may include zinc (Zn), germanium (Ge), silver (Ag), magnesium (Mg), gold (Au), copper (Cu), calcium (Ca), or a combination thereof. In addition, when the low reflective layer AL2 contains a metal oxide, it may include, for example, SiO2, TiO2, ZrO2, Ta2O5, HfO2, Al2O3, ZnO, Y2O3, BeO, MgO, PbO2, WO3, SiNx, LiF, CaF2, MgF2, CdS, or a combination thereof.

In the embodiment, an absorption coefficient (k) of the inorganic material included in the low reflective layer AL2 may be 4.0 or less and 0.5 or more ($0.5 \leq k \leq 4.0$). In addition, the inorganic material included in the low reflective layer AL2 may have a refractive index (n) of 1 or more ($n \geq 1.0$).

The low reflective layer AL2 induces destructive interference between the light incident into the display device and the light reflected from the metal disposed under the low reflective layer AL2, thereby reducing reflection of external light. Accordingly, the display quality and visibility of the display device can be improved by reducing the reflection of the external light of the display device through the low reflective layer AL2. The encapsulation layer ENC is positioned on the low reflective layer AL2. The encapsulation layer ENC may cover and seal not only the top surface of the light emitting diode, but also the side surfaces. Since the light emitting diode is very vulnerable to moisture and oxygen, the encapsulation layer ENC seals the light emitting diode to block the inflow of external moisture and oxygen.

The encapsulation layer ENC may include a plurality of layers, which includes a composite film including both an inorganic layer and an organic layer. For example, the encapsulation layer ENC may be a sequentially formed triple layer of a first encapsulation layer EIL1, an encapsulation organic layer EOL, and a second encapsulation layer EIL2.

The first encapsulation inorganic layer EIL1 may cover the second electrode E2. The first encapsulation inorganic layer EIL1 can prevent external moisture or oxygen from penetrating into the light emitting diode. For example, the first encapsulation inorganic layer EIL1 may include a silicon nitride, a silicon oxide, a silicon oxynitride, or a combination thereof. The first encapsulation inorganic layer EIL1 may be formed through a deposition process.

The encapsulation organic layer EOL may be disposed on the first encapsulation inorganic layer EIL1 and contact the first encapsulation inorganic layer EIL1. Curves formed on the upper surface of the first encapsulation inorganic layer EIL1 or particles existing on the first encapsulation inorganic layer EIL1 are covered by the encapsulation organic layer EOL, and thus it is possible to prevent a surface state of an upper surface of the first encapsulation inorganic layer EIL1 from influencing the components disposed on the encapsulation organic layer EOL. In addition, the encapsulation organic layer EOL may relieve the stress between the contacting layers. The encapsulation organic layer EOL may contain organic materials and may be formed through solution processes such as spin coating, slit coating, and inkjet processes.

The second encapsulation inorganic layer EIL2 is disposed on the encapsulation organic layer EOL to cover the encapsulation organic layer EOL. The second encapsulation inorganic layer EIL2 may be stably formed on a relatively flat surface than dispose on the first encapsulation inorganic layer DLL The second encapsulation inorganic layer EIL2 prevents inflow to the outside by encapsulating moisture emitted from the encapsulation organic layer EOL. The second encapsulation inorganic layer EIL2 may include a silicon nitride, a silicon oxide, a silicon oxynitride, or a combination thereof. The second encapsulation inorganic layer EIL2 may be formed through a deposition process.

The first conductive layer TL1, the first touch insulating layer TIL1, the second conductive layer TL2, and the second touch insulating layer TIL2 may be positioned on the encapsulation layer ENC. The first conductive layer TL1, the first touch insulating layer TIL1, the second conductive layer TL2, and the second touch insulating layer TIL2 may form the touch sensor TS shown in FIG. 3.

The first conductive layer TL1 may be directly disposed on the encapsulation layer ENC. In this case, the first conductive layer TL1 may be directly disposed on the second encapsulation inorganic layer EIL2 of the encapsulation layer ENC. However, the present invention is not limited thereto.

The display device according to the embodiment may include an insulating layer (not shown) interposed between the first conductive layer TL1 and the encapsulation layer ENC. The insulating layer may be disposed on the second encapsulation inorganic layer EIL2 of the encapsulation layer ENC to planarize a surface on which the first conductive layer TL1 and the like are disposed. In this case, the first conductive layer TL1 may be directly disposed on the insulating layer. The insulating layer may include an inorganic insulator such as a silicon oxide ($SiO_2$), a silicon nitride (SiNx), or a silicon oxynitride ($SiO_xN_y$). Alternatively, the insulating layer may include an organic insulator.

In the embodiment, the first touch insulating layer TIL1 may be disposed on the first conductive layer TL1. The first touch insulating layer TIL1 may be formed of or include an inorganic or organic material. When the first touch insulating layer TIL1 is formed of an inorganic material, the first touch insulating layer TIL1 may include at least one selected from a group consisting of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. When the first touch insulating layer TIL1 is formed of an organic material, the first touch insulating layer TIL1 may include at least one selected from a group consisting of an acryl-based resin, a methacrylic resin, polyisoprene, a vinyl-based resin, an epoxy-based resin, a urethane-based resin, a cellulose-based resin, and a perylene-based resin.

In the embodiment, the second conductive layer TL2 may be disposed on the first touch insulating layer TIL1. The second conductive layer TL2 may serve as a sensor that detects the user's touch input. The first conductive layer TL1 may serve as a connector connecting a patterned second conductive layer TL2 in one direction. In the embodiment, both the first conductive layer TL1 and the second conductive layer TL2 may serve as a sensor. In this case, the first conductive layer TL1 and the second conductive layer TL2 may be electrically connected to each other through a contact hole. As both the first conductive layer TL1 and the second conductive layer TL2 serve as sensors, resistance of a touch electrode is reduced, and thus the user's touch input can be quickly sensed.

In the embodiment, the first conductive layer TL1 and the second conductive layer TL2 may have, for example, a mesh structure, and thus light emitted from the light emitting diode ED can pass therethrough. In this case, the first conductive layer TL1 and the second conductive layer TL2 may be disposed so as to not overlap the emission layer EML in the plan view.

The first conductive layer TL1 and the second conductive layer TL2 may include a metal layer or a transparent conductive layer. The metal layer may include molybdenum (Mo), silver (Ag), titanium (Ti), copper (Cu), aluminum (Al), and an alloy thereof. The transparent conductive layer may include a transparent conductive oxide such as indium tin oxide (ITO), indium zinc oxide (IZO), zinc oxide (ZnO), and indium tin zinc oxide ("ITZO"). In addition, the transparent conductive layer may include a conductive polymer such as PEDOT, metal nanowires, carbon nanotubes, or graphene.

In the embodiment, the second touch insulating layer TIL2 may be disposed on the second conductive layer TL2. The second touch insulating layer TIL2 may include an inorganic material or an organic material. When the second touch insulating layer TIL2 includes an inorganic material, the second touch insulating layer TIL2 may include at least one selected from a group consisting of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. When the second touch insulating layer TIL2 includes an organic material, the second touch insulating layer TIL2 may include at least one selected from a group consisting of an acryl-based resin, a methacrylic resin, polyisoprene, a vinyl-based resin, an epoxy-based resin, a urethane-based resin, a cellulose-based resin, and a perylene-based resin.

A light blocking layer BM may be positioned on the second touch insulating layer TIL2. The light blocking layer BM may define a 2-1 opening OP2-1 overlapping the emission layer EML in the plan view. The light blocking layer BM may overlap at least a part of the pixel defining layer PDL in the plan view.

The 2-1 opening OP2-1 may overlap the 1-1 opening OP1-1 of the pixel defining layer PDL in the plan view. A size of the 2-1 opening OP2-1 may be larger than a size of the 1-1 opening OP1-1 on a plane, and the 2-1 opening OP2-1 may have a shape surrounding the 1-1 opening OP1-1. The 2-1 opening OP2-1 may have a planar shape that is substantially similar to a shape of the 1-1 opening OP1-1. In the embodiment shown in the drawing, the 2-1 opening OP2-1 has a circular shape on a plane, but this is not restrictive, and may have any shape such as a rhombus or an octagonal shape similar to a rhombus or an octagonal shape similar to a rhombus on a plane, a quadrangle, a polygon, or an oval.

A reflection adjusting layer OL1 may be disposed on the light blocking layer BM. The reflection adjusting layer OL1 may selectively absorb light of a wavelength of a partial band among light reflected inside the display device or light incident outside the display device. The reflection adjusting layer OL1 may fill the 2-1 opening OP2-1.

For example, the reflection adjusting layer OL1 absorbs a first wavelength region of 490 nm to 505 nm and a second wavelength region of 585 nm to 600 nm, and thus light transmittance in the first wavelength region and second wavelength region may be 40% or less. The reflection adjusting layer OL1 may absorb light of a wavelength outside the emission wavelength range of red, green, or blue emitted from the light emitting diode ED. As described, the reflection adjusting layer OL1 absorbs light of a wavelength that does not belong to a wavelength range of red, green, or blue emitted from the light emitting diode, thereby preventing or minimizing the reduction in luminance of the display device and simultaneously preventing or minimizing the deterioration of the luminous efficiency and improving visibility of the display device.

In the embodiment, the reflection adjusting layer OL1 may be provided as an organic material layer including a dye, a pigment, or combination thereof. The reflection adjusting layer OL1 may contain a tetraazaporphyrin ("TAP")-based compound, a porphyrin-based compound, a metal porphyrin-based compound, an oxazine-based compound, and a squarylium-based compound, a triarylmethane compound, a polymethine compound, an anthraquinone compound, a phthalocyanine compound, an azo compound, a perylene compound, a xanthene-based compound, a diammonium-based compound, a dipyrromethene-based compound, a cyanine-based compound, and a combination thereof.

For example, the reflection adjusting layer OL1 may contain a compound represented by any one of Chemical Formula 1 to Chemical Formula 4. Chemical Formula 1 to Chemical Formula 4 may have a chromophore structure corresponding to some of the compounds described above. Chemical Formula 1 to Chemical Formula 4 are only examples, but the present invention is not limited thereto.

<Chemical Formula 1>

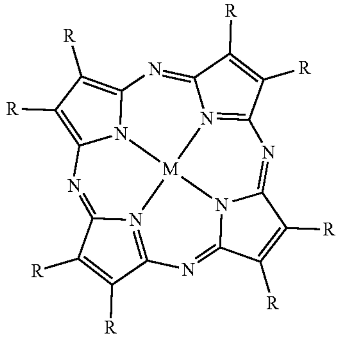

<Chemical Formula 2>

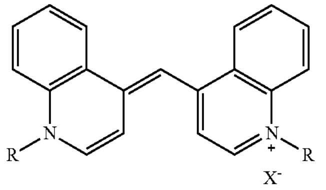

<Chemical Formula 3>

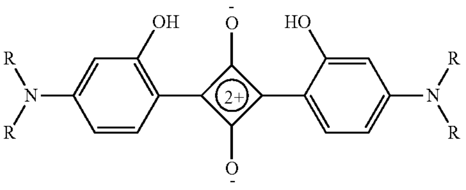

<Chemical Formula 4>

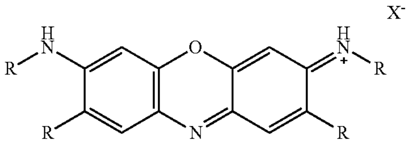

Here, in Chemical Formula 1 to Chemical Formula 4,

M is a metal,

X— is a monovalent negative ion, each R is the same as or different from each other, and each may be hydrogen, heavy hydrogen (-D), —F, —Cl, —Br, —I, a hydroxyl group, a cyano group, or a nitro group; heavy hydrogen, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si $Q_{11}$, $Q_{12}$, and $Q_{13}$, —N $Q_{11}$, and $Q_{12}$, —B $Q_{11}$, and $Q_{12}$, —C(═O) $Q_{11}$, —S(═O)$_2$ $Q_{11}$, —P(═O) $Q_{11}$, and $Q_{12}$, or an unsubstituted or substituted with any combination thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, heavy hydrogen, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si $Q_{21}$, $Q_{22}$, and $Q_{23}$, —N $Q_{21}$, and $Q_{22}$, —B $Q_{21}$, and $Q_{22}$, —C(═O) $Q_{21}$, —S(═O)$_2$ $Q_{21}$, —P(═O) $Q_{21}$, and $Q_{22}$, or unsubstituted or substituted with any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, or —Si $Q_{31}$, $Q_{32}$, and $Q_{33}$, —N $Q_{31}$, and $Q_{32}$, —B $Q_{31}$, and $Q_{32}$, —C(═O) $Q_{31}$, —S(═O)$_2$ $Q_{31}$, or —P(═O) $Q_{31}$, and $Q_{32}$.

The $Q_1$ to $Q_3$, $Q_{11}$ to $Q_{13}$, $Q_{21}$ to $Q_{23}$, and $Q_{31}$ to $Q_{33}$ may be independently hydrogen; heavy hydrogen; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; heavy hydrogen; —F; a cyano group; a $C_1$-$C_{60}$ alkyl group; a $C_1$-$C_{60}$ alkoxy group; a phenyl group; a biphenyl group; or unsubstituted or substituted with any combination thereof, a $C_3$-$C_{60}$ carbocyclic group; or a $C_1$-$C_{60}$ heterocyclic group.

In the embodiment, the X— may be a halide ion, a carbolate ion, a nitrate ion, a sulfonate ion, or a bisulfate ion. For example, the X may be $F^-$, $Cl^-$, $Br^-$, $I^-$, $CH_3COO^-$, $NO_3^-$, $HSO_4^-$, a propionate ion, a benzene sulfonate ion, and the like.

In the embodiment, a reflectance measured in the specular component included ("SCI") mode on the surface of the reflection adjusting layer OL1 may be 10% or less. That is, the reflection adjusting layer OL1 absorbs external light reflection of the display device, thereby improving visibility.

The display device according to the present embodiment may include the low reflective layer AL2 and the reflection adjusting layer OL1 without using a polarization film to reduce external light reflection.

In the embodiment, the reflection adjusting layer OL1 may have transmittance of about 64% to 72%. The transmittance of the reflection adjusting layer OL1 may be adjusted according to the content of the pigment and/or dye included in the reflection adjusting layer OL1.

A first organic layer OL2 may be positioned on the reflection adjusting layer OL1. The first organic layer OL2 may overlap at least a portion of the light blocking layer BM and may overlap at least a portion of the pixel defining layer PDL in the plan view.

The first organic layer OL2 may include a light transmissive organic material with a low refractive index. For example, the first organic layer OL2 may include at least one of acryl (acrylic) resin, polyimide (polyimide) resin, polyamide resin, and Alq3 [Tris (8-hydroxyquinolinato)aluminum]. The first organic layer OL2 may have a relatively smaller refractive index than a second organic layer OL3, which will be described later.

The first organic layer OL2 may define a 4-1 opening OP4-1 overlapping the 1-1 opening OP1-1 and the 2-1 opening OP2-1 in the plan view.

The 4-1 opening OP4-1 may overlap the 1-1 opening OP1-1 of the pixel defining layer PDL and the 2-1 opening OP2-1 of the light blocking layer BM in the plan view. A size of the 4-1 opening OP4-1 may be larger than a size of the 1-1 opening OP1-1 and the 2-1 opening OP2-1 on a plane, and the 4-1 opening OP4-1 may have a shape surrounding the 1-1 opening OP1-1 and the 2-1 opening OP2-1. The 4-1 opening OP4-1 may have a planar shape substantially similar to a shape of the 1-1 opening OP1-1 and the 2-1 opening OP2-1. In the embodiment, the 4-1 opening OP4-1 has a circular shape on a plane, but is not limited thereto, and may have any shape such as a rhombus or an octagonal shape similar to a rhombus or a rhombus on a plane, a quadrangle, a polygon, or an oval in another embodiment.

The second organic layer OL3 may be positioned on top of the first organic layer OL2. The second organic layer OL3 may have a shape that overlaps the front surface of the substrate SUB in the plan view. The second organic layer OL3 may include a light transmissive organic material with a high refractive index. The second organic layer OL3 may have a relatively greater refractive index than the first organic layer OL2.

The second organic layer OL2 may be formed of or include an organic insulating material.

The refractive index of the second organic layer OL2 may be adjusted according to a functional group included in the second organic layer OL2. Alternatively, the refractive index of the second organic layer OL2 may be adjusted according to the type and content of nanoparticles included in the second organic layer OL2.

The second organic layer OL2 may include any material having a higher refractive index than the first organic layer OL1, for example, a layer formed of a material in which hollow silica is dispersed in an acryl-based resin, a siloxane resin, or the like, and in this case, the refractive index of the second organic layer OL2 may be about 1.30 to about 1.53. Alternatively, the second organic layer OL2 may include a layer formed of an acryl-based resin including fluorine (F), and in this case, a refractive index may be about 1.38 to about 1.53. Alternatively, the second organic layer OL2 may include a layer formed of a material including a functional group such as an aromatic ring in a binder of a resin such as acryl-based resin, a siloxane resin, polyimide, and the like, and in this case, the refractive index of the second organic layer OL2 may be about 1.50 to about 1.65. Alternatively, the second organic layer OL2 may include a layer formed of an acryl-based resin containing halogen elements such as iodine (I) and bromine (Br) or elements such as sulfur (S), phosphorus (P), and silicon (Si). In this case, the refractive index of the second organic layer OL2 may be about 1.60 to about 1.70. Alternatively, the second organic layer OL2 may include a layer formed of an acryl-based resin including nanoparticles such as titanium oxide ($TiO_2$), zirconium oxide ($ZrO_2$), graphene, and the like, and in this case, the refractive index may be about 1.50 to about 1.90. Alternatively, the second organic layer OL2 may include a layer formed of an organometallic polymer including an acryl-based resin, a siloxane resin, and the like, and in this case, the refractive index of the second organic layer OL2 may be about 1.60 to about 1.90. The refractive index mentioned above may be a value measured using light (sodium D-line) of about 589 nm.

The second organic layer OL3 may be positioned within the 4-1 opening OP4-1 of the first organic layer OL2. In this case, the second organic layer OL3 may be in contact with the side of the first organic layer OL2. In addition, the second organic layer OL3 may be positioned to cover the top surface of the first organic layer OL2.

At least a part of light generated by the light emitting diode ED is totally reflected at the interface of the first organic layer OL2 and the second organic layer OL3, and thus the light can be focused in the front. Specifically, light generated from the emission layer EML can be emitted in various directions, and at least a portion of the light incident on the second organic layer OL3 is reflected at the interface between the first organic layer OL2 and the second organic layer OL3. In particular, when an incident angle of the light incident on the second organic layer OL3 is larger than a threshold angle, the incident light can be totally reflected at the interface between the first organic layer OL2 and the second organic layer OL3. That is, total reflection may occur at the interface between the first organic layer OL2 and the second organic layer OL3 while light incident on the second organic layer OL3 having a relatively large refractive index proceeds to the first organic layer OL2 having a relatively small refractive index.

Figure 9A:
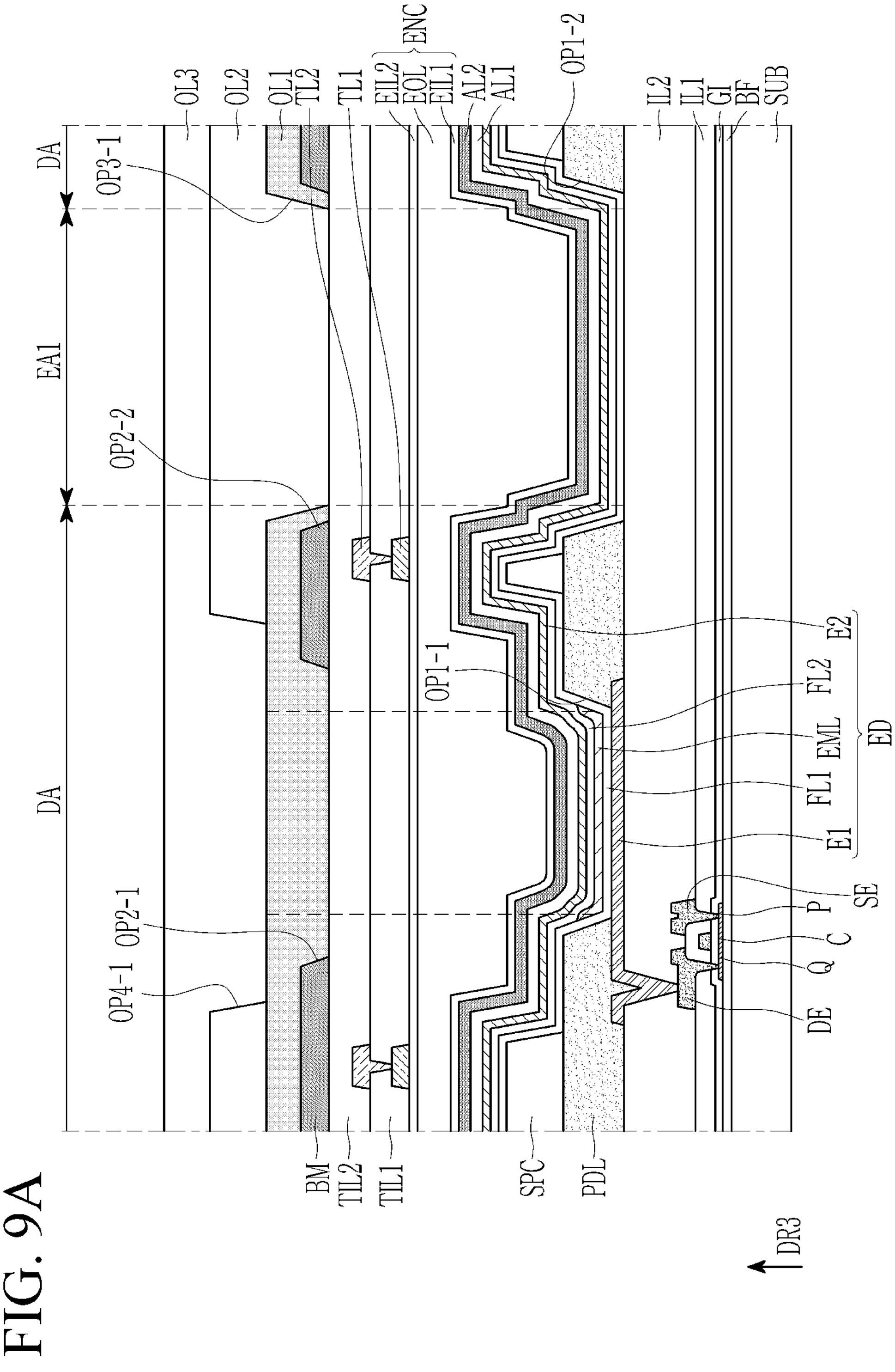
FIG. 9A is a cross-sectional view of constituent elements disposed in the display area and the first element area.
Figure 9B:
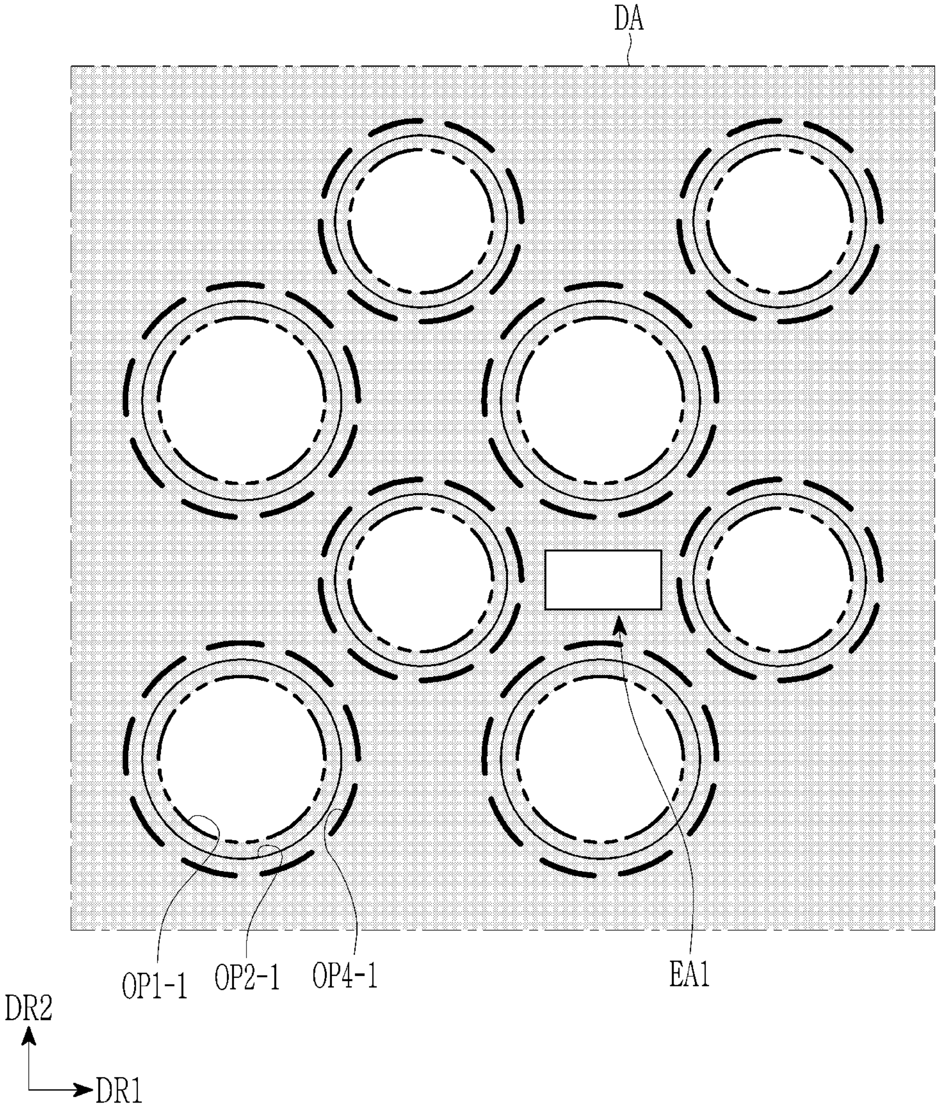
FIG. 9B is a top plan view of some configurations of the display area and the first element area according to the embodiment.

Hereinafter, referring to FIG. 9A and FIG. 9B, a stacked structure of the first element area EA1 disposed adjacent to the display area DA will be described. FIG. 9A is a cross-sectional view of constituent elements disposed in the display area DA and the first element area EA1, and FIG. 9B is a top plan view of some configurations of the display area DA and the first element area EA1 according to the embodiment. Since a description of the planar and cross-section structure for the display area DA is the same as the contents described with reference to FIG. 7 and FIG. 8, the same content as that described will be omitted below. The first element area EA1 will be described.

The first element area EA1 is formed of a transparent layer to allow light to pass through, and no conductive layer or semiconductor layer is positioned. The pixel defining layer, the light blocking layer BM, and the like including the light blocking material may have a structure that does not block light by defining an opening overlapping a position corresponding to the first element area EA1 in the plan view.

The first element area EA1 includes a buffer layer BF, a gate insulating layer GI, a first insulating layer ILL and a second insulating layer IL2 that are disposed on the substrate SUB.

The pixel defining layer PDL according to the embodiment may define a 1-2 opening OP1-2 overlapping the first element area EA1 in the plan view. The pixel defining layer PDL containing the light blocking material may be spaced apart without overlapping the first element area EA1 in the plan view.

The first element area EA1 may include a first functional layer FL1, a second functional layer FL2, a second electrode E2, a capping layer AL1, a low reflective layer AL2, and an encapsulation layer ENC that are disposed on the second insulating layer IL2.

The first touch insulating layer TIL1 and second touch insulating layer TIL2 may be disposed on the encapsulation layer ENC. The first conductive layer TL1 and the second conductive layer TL2 included in the touch sensor may not overlap the first element area EA1 in the plan view.

A 2-2 opening OP2-2 defined by the light blocking layer BM may be positioned on the second touch insulating layer TIL2. The first element area EA1 may overlap the 2-2 opening OP2-2 of the light blocking layer BM in the plan view. The first element area EA1 may not overlap a light blocking layer BM that blocks light in the plan view. The first element area EA1 may overlap a 3-1 opening OP3-1 of the reflection adjusting layer OL1 in the plan view. The reflection adjusting layer OL1 may define the 3-1 opening OP3-1 overlapping the first element area EA1 in the plan view. The 3-1 opening OP3-1 may have a shape that is similar to a shape of the first element area EA1. That is, the reflection adjusting layer OL1 may have a shape with a part thereof removed from the first element area EA1.

Although the present specification shows an embodiment in which the opening is formed in such a way that the reflection adjusting layer OL1 covers the side surface of the light blocking layer BM, it is not limited thereto, and the side surfaces of the reflection adjusting layer OL1 and the light blocking layer BM are aligned to form a single surface, or the reflection adjusting layer OL1 may be formed on the upper surface of the light blocking layer BM in various forms.

The first organic layer OL2 may fill the 3-1 opening OP3-1 of the reflection adjusting layer OL1. The first organic layer OL2 may be positioned within the 2-2 opening OP2-2 of the light blocking layer BM. The first organic layer OL2 may provide a flat top surface while filling a plurality of openings. The second organic layer OL3 may be positioned on the first organic layer OL2.

According to the embodiment, since the light blocking layer BM and the reflection adjusting layer OL1 are removed in the first element area EA1, transmittance may be excellent.

Figure 10A:
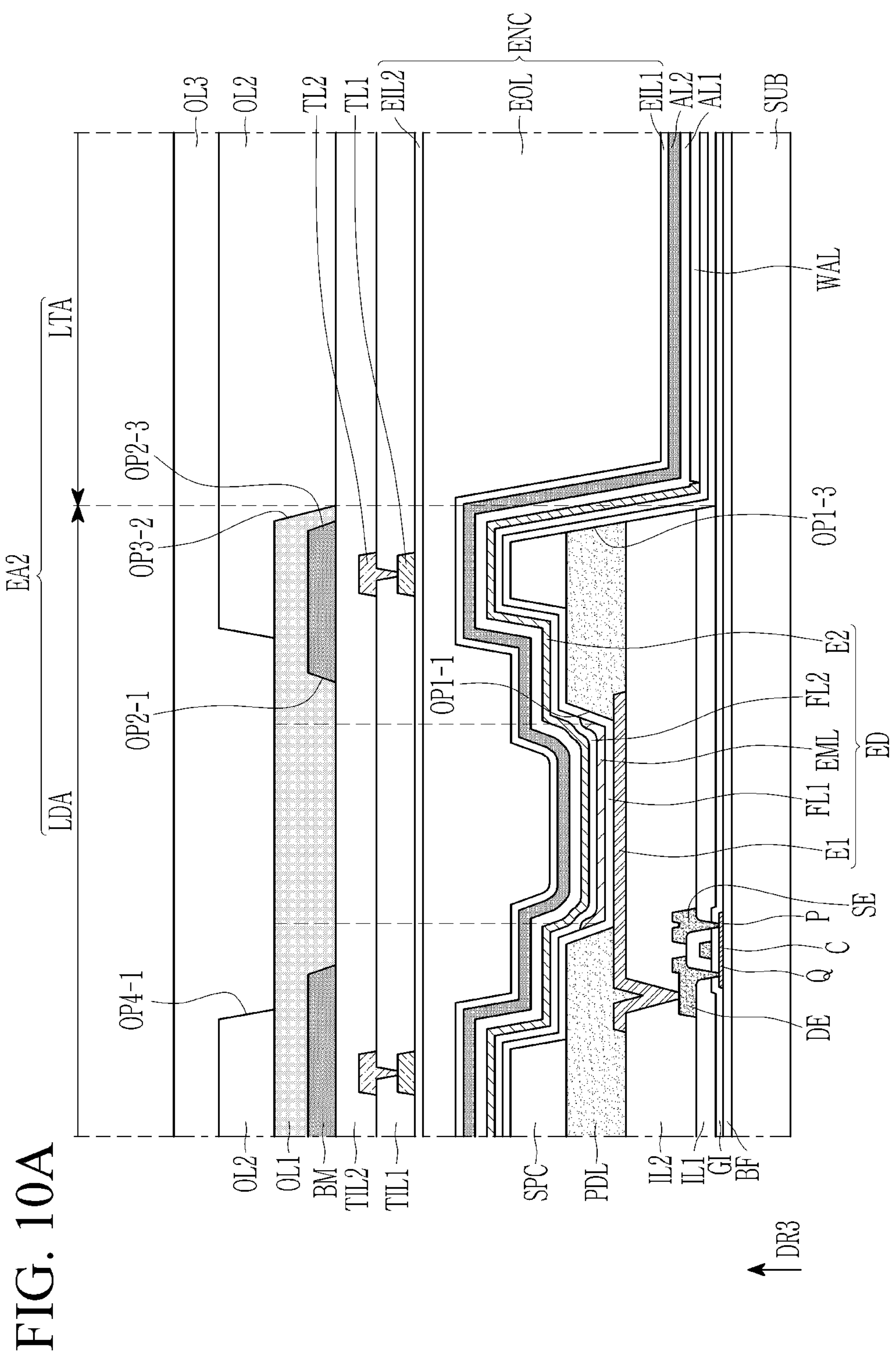
FIG. 10A is a cross-sectional view of constituent elements disposed in the second element area.
Figure 10B:
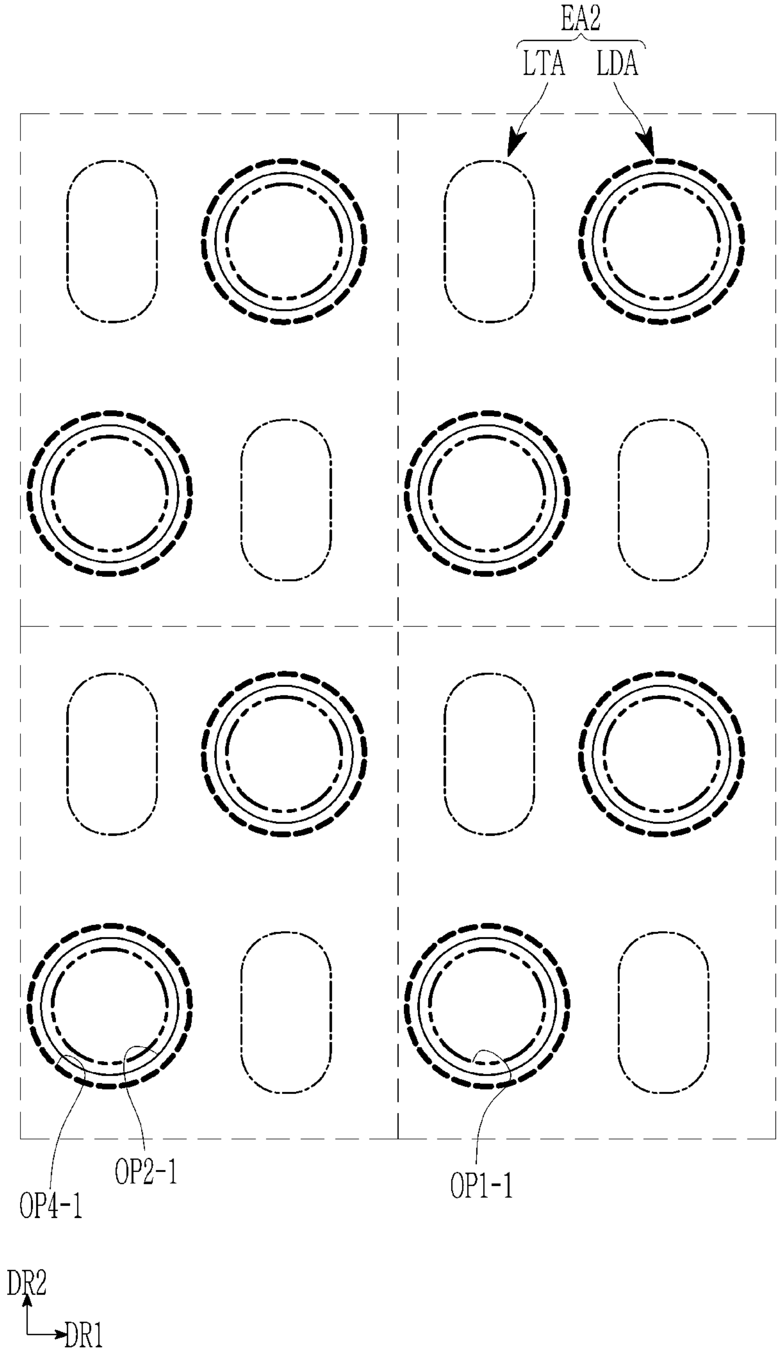
FIG. 10B is a top plan view of some configurations of the second element area.

Hereinafter, a stacked structure of the second element area EA2 will be described with reference to FIG. 10A and FIG. 10B. FIG. 10A is a cross-sectional view of constituent elements disposed in the second element area EA2, and FIG. 10B is a top plan view of some configurations of the second element area EA2. A description of the above-described constituent element and the same constituent element will be omitted.

The second element area EA2 includes a display portion LDA where a plurality of pixels is disposed, and a light transmissive portion LTA. A description of the region in which the light emitting diode ED is positioned among the planar and cross-sectional structures of the display portion LDA is the same as that described in FIG. 7 and FIG. 8 regarding the display area DA, and therefore, it will be omitted below.

Hereinafter, the light transmissive portion LTA will be described. The second element area EA2 may have relatively high light transmittance compared to the display area DA by including the light transmissive portion LTA. The second element area EA2 is a region positioned on the front surface of the second optical element ES2 described above, and has a structure in which a display portion LDA including a plurality of pixels is included and additionally a transmission portion LTA disposed between adjacent display portions LDA is formed. The display portion LDA may have one unit structure by adding a plurality of pixels, and a transmission portion LTA may be positioned between adjacent unit structures of the display portions LDA.

The light transmissive portion LTA is formed of only a transparent layer and thus light can pass through the light transmissive portion LTA. No conductive layer or semiconductor layer is disposed in the light transmissive portion LTA, and the light transmissive portion LTA may have a structure not blocking light, since the pixel defining layer PDL, the light blocking layer BM, and the like defines openings overlapping the light transmissive portion LTA in the plan view.

The light transmissive portion LTA may include a buffer layer BF and a gate insulating layer GI that are disposed on the substrate SUB. In the present embodiment of the specification, the first insulating layer ILL the second insulating layer IL2, the pixel defining layer PDL, and the spacer SPC are not positioned in the light transmissive portion LTA, but among these layers, there may be a modification in the structure such that the transparent layer may also be positioned the light transmissive portion LTA. Alternatively, it may be transformed into a structure in which all or part of the buffer layer BF and the gate insulating layer GI are removed.

The pixel defining layer PDL according to the embodiment may define a 1-3 opening OP1-3 that overlaps the light transmissive portion LTA in the plan view. The pixel defining layer PDL may have a shape with a part thereof removed from the light transmissive portion LTA. The pixel defining layer PDL containing a light blocking material may be spaced apart without overlapping the light transmissive portion LTA in the plan view.

A first functional layer FL1 and a second functional layer FL2 extending from the display portion LDA may be positioned on the light transmissive portion LTA.

In the light transmissive portion LTA, an end of the second electrode E2 extending from the display portion LDA may be disposed on the second functional layer FL2. The second electrode E2 may not be positioned in most regions of the light transmissive portion LTA. However, the present invention is not limited thereto, and the second electrode E2 may be removed so as to not completely overlap the light transmissive portion LTA in another embodiment.

In addition, a low adhesive layer WAL may be positioned in the light transmissive portion LTA. The low adhesive layer WAL may be positioned on the second functional layer FL2 in the light transmissive portion LTA. The low adhesive layer WAL is a material with weak adherence, and as shown in FIG. 10A, the second electrode E2 may not be disposed on an upper surface of the low adhesive layer WAL, or the second electrode E2 may include a material having a characteristic in which a very thin film is formed.

For example, the low adhesive layer WAL may be formed by using a material such as 8-quinolinatolithium (Liq; [8-Quinolinolato Lithium]), N,N-diphenyl-N,N-bis(9-phenyl-9H-carbazol-3-yl) Biphenyl-4,4'-diamine (N,N-diphenyl-N,N-bis(9-phenyl-9H-carbazol-3-yl)biphenyl-4,4'-diamine; HT01), N (di-Phenyl-4-yl)9,9-dimethyl-N-(4(9-phenyl-9H-carbazol-3-yl)phenyl)-9H-fluoren-2-amine (N(diphenyl-4-yl) 9,9-dimethyl-N-(4 (9-phenyl-9H-carbazol-3-yl)phenyl)-9H-fluorene-2-amine; HT211), 24449,10-di(naphthalene)-2-yl) anthracen-2-yl)phenyl)-1-phenyl-1H-benzo-[D]imidazole (2-(4-(9,10-di(naphthalene-2-yl) anthracene-2-yl)phenyl)-1-phenyl-1H-benzo-[D]imidazole; LG201), and the like.

In the present specification, an embodiment in which the low adhesive layer WAL is positioned in the light transmissive portion LTA to remove the second electrode E2 is illustrated and described, but in another embodiment, the second electrode E2 may be removed through a laser process or the like. The laser process may be a removal process performed on the second electrode E2, and in this case, the low adhesive layer WAL is not positioned on the light transmissive portion.

In the light transmissive portion LTA, a capping layer AL1 and a low reflective layer AL2, and an encapsulation layer ENC may be disposed on the low adhesive layer WAL. In particular, the organic encapsulation layer EOL may have a shape that fills the 1-3 openings OP1-3, and the organic encapsulation layer EOL may provide a flat top surface.

The first touch insulating layer TIL1 and the second touch insulating layer TIL2 may be positioned on the encapsulation layer ENC. The first conductive layer TIL1 and the second conductive layer TL2 included in the touch sensor may not overlap the light transmissive portion LTA in the plan view.

A 2-3 opening OP2-3 defined by the light blocking layer BM may be positioned on the second touch insulating layer TIL2. The light transmissive portion LTA may overlap the 2-3 opening OP2-3 of the light blocking layer BM in the plan view. The light blocking layer BM may have a form with a part thereof removed from the light transmissive portion LTA. That is, the light transmissive portion LTA may not overlap the light blocking layer BM that blocks light in the plan view.

The light transmissive portion LTA may overlap a 3-2 opening OP3-2 of the reflection adjusting layer OL1 in the plan view. The reflection adjusting layer OL1 may have a shape with a part thereof removed from the light transmissive portion LTA. The reflection adjusting layer OL1 having a substantial thickness may be spaced apart from the light transmissive portion LTA.

The present specification shows an embodiment in which the reflection adjusting layer OL1 defines an opening in a form that covers the side surface of the light blocking layer BM, but is not limited thereto, and various shapes may be possible such that the side surfaces of the reflection adjusting layer OL1 and the light blocking layer BM are aligned to form a single surface, or the reflection adjusting layer OL1 may be disposed only on the upper surface of the light blocking layer BM.

The first organic layer OL2 may fill the 3-2 opening OP3-2 of the reflection adjusting layer OL1. The first organic layer OL2 may be positioned within the 2-3 opening OP2-3 of the light blocking layer BM. The first organic layer OL2 may provide a flat top surface while filling a plurality of openings. A second organic layer OL3 may be positioned on the first organic layer OL2.

The second element area EA2 according to the embodiment may include a display portion LDA and a light transmissive portion LTA that are alternately disposed. As shown in FIG. 10B, two display portions LDA and two light transmissive portions LTA may be repeatedly disposed in a matrix form while forming one unit. However, such an alignment is only an embodiment and can be transformed into various forms.

According to the embodiment, since parts of the light blocking layer BM and the reflection adjusting layer OL1 are removed from the light transmissive portion LTA, transmittance may be excellent.

Figure 11A:
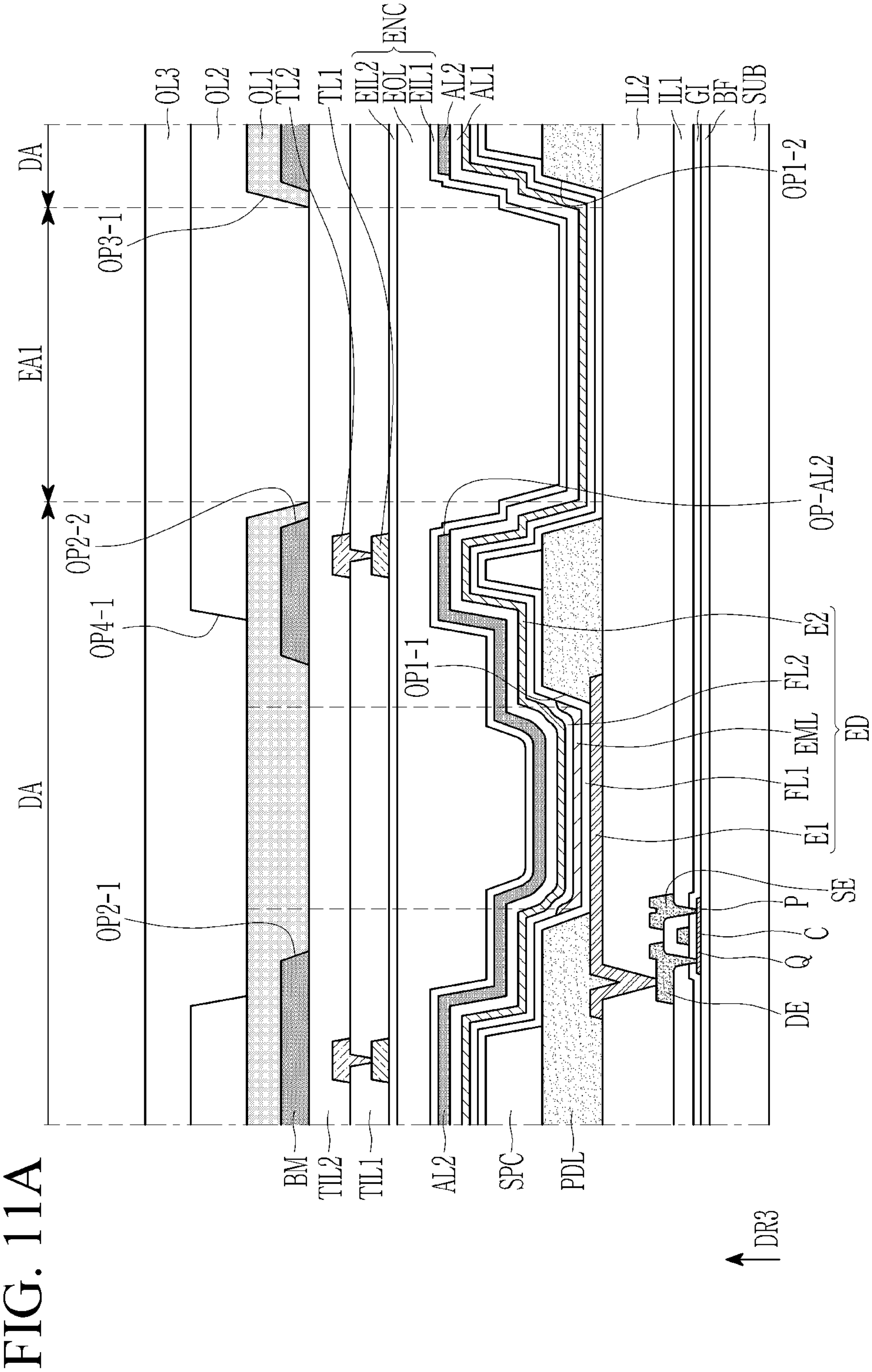
FIG. 11A is a cross-sectional view of a first element area of a display device according to another embodiment.
Figure 11B:
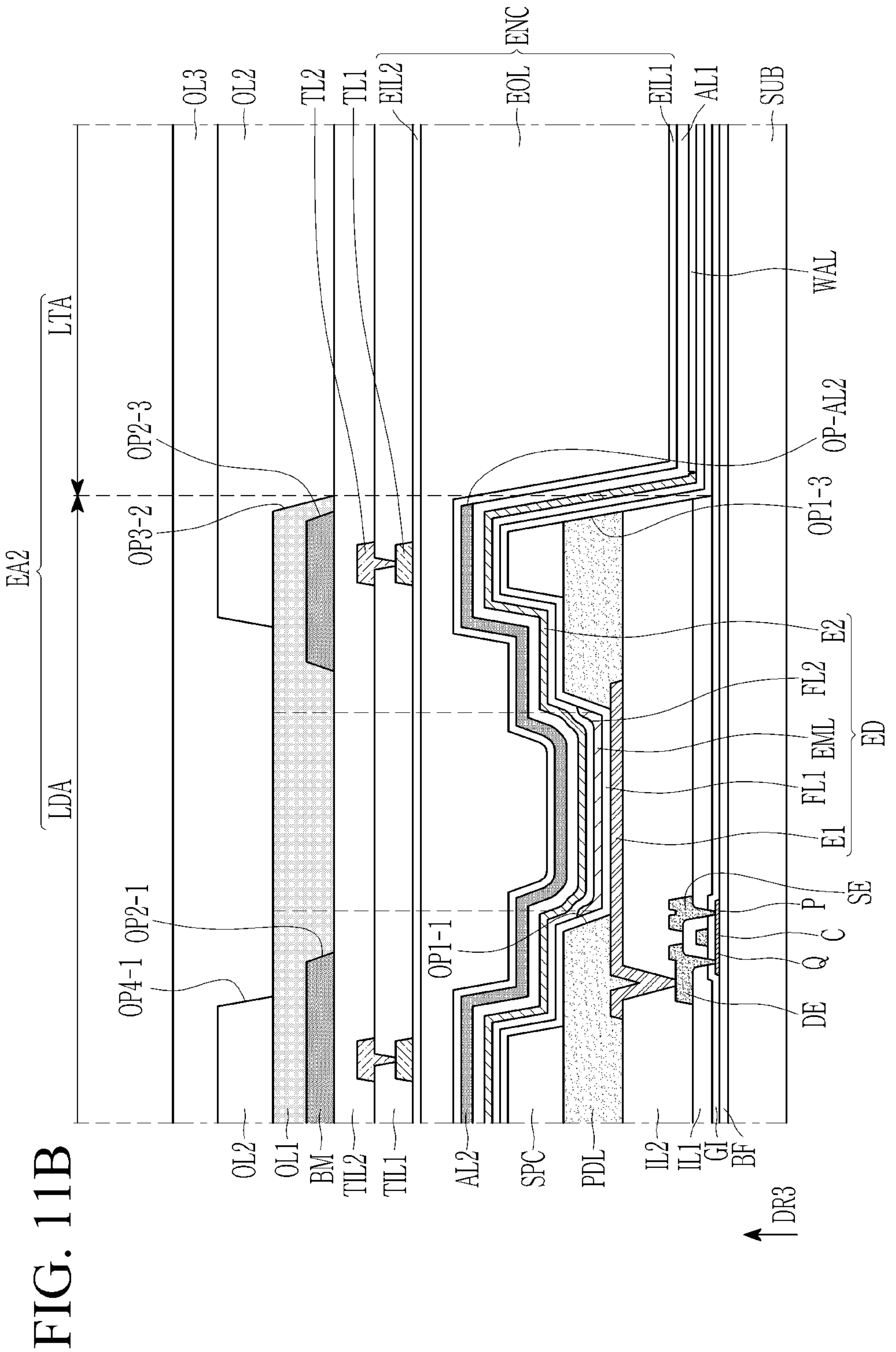
FIG. 11B is a cross-sectional view of a second element area according to another embodiment.

Hereinafter, a display device according to another embodiment will be described with reference to FIG. 11A and FIG. 11B. FIG. 11A is a cross-sectional view of a first element area of a display device, and FIG. 11B is a cross-sectional view of a second element area. A description of the above-described constituent elements will be omitted.

Referring to FIG. 11A, a low reflective layer AL2 according to this embodiment may define an opening OP-AL2 that overlaps a first element area EA1 in a plan view. The opening OP-AL2 defined by the low reflective layer AL2 may overlap a 1-2 opening OP1-2 defined by a pixel defining layer PDL, a 2-2 opening OP2-2 defined by a light blocking layer BM, and a 3-1 opening OP3-1 defined by a reflection adjusting layer OL1 in a plan view. In addition, the opening OP-AL2 defined by the low reflective layer AL2 may overlap the first organic layer OL2 and the second organic layer OL3. In other words, the low reflective layer AL2 may have a shape with a part thereof removed from the first element area EA1.

According to the embodiment, more improved transmittance can be secured by removing a part of the low reflective layer AL2 in the first element area EA1.

Referring to FIG. 11B, a low reflective layer AL2 according to this embodiment may define an opening OP-AL2 overlapping a second element area EA2, particularly a light transmissive portion LTA in the plan view. The opening OP-AL2 defined by the low reflective layer AL2 may overlap a 1-3 opening OP1-3 defined by a pixel defining layer PDL, a 2-3 opening OP2-3 defined by a light blocking layer BM, and a 3-2 opening OP3-2 defined by a reflection adjusting layer OL1 in the plan view. In addition, the opening OP-AL2 defined by the low reflective layer AL2 may overlap the first organic layer OL2 and the second organic layer OL3. That is, the low reflective layer AL2 may have a shape with a part thereof removed from the light transmissive portion LTA.

According to the embodiment, in the light transmissive portion LTA, a part of the low reflective layer AL2 is removed and thus the second element area EA2 can secure more improved transmittance.

Figure 12A:
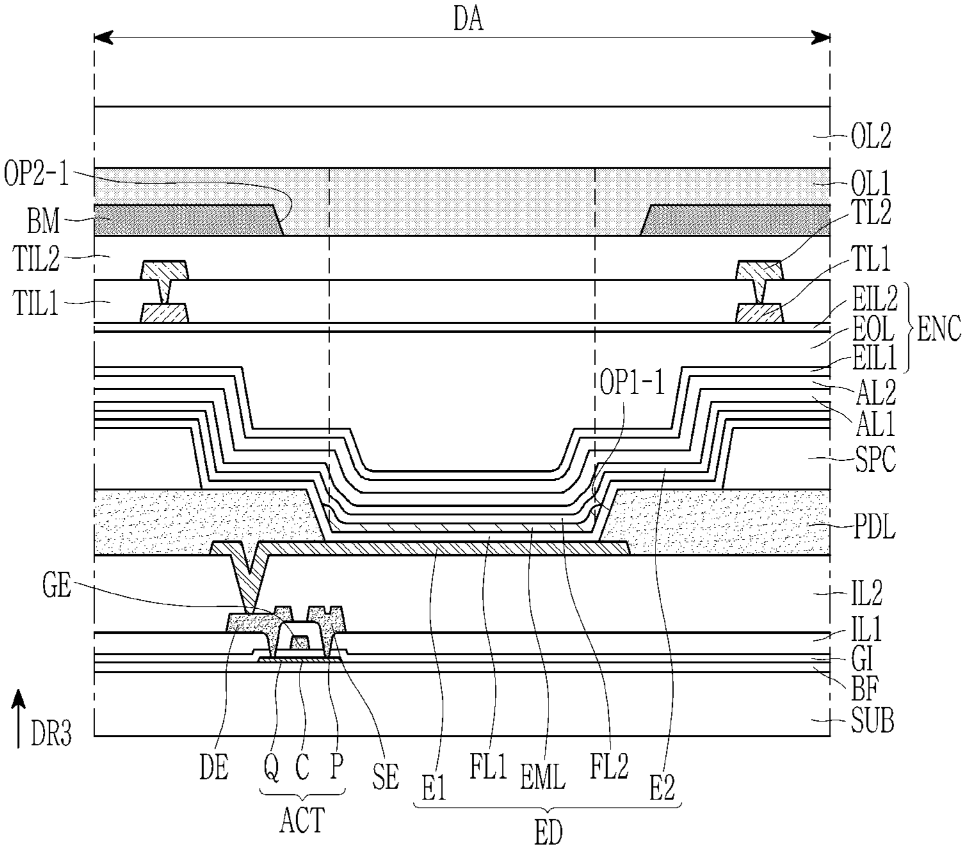
FIG. 12A is a cross-sectional view of a display area of a display device according to still another embodiment.
Figure 12B:
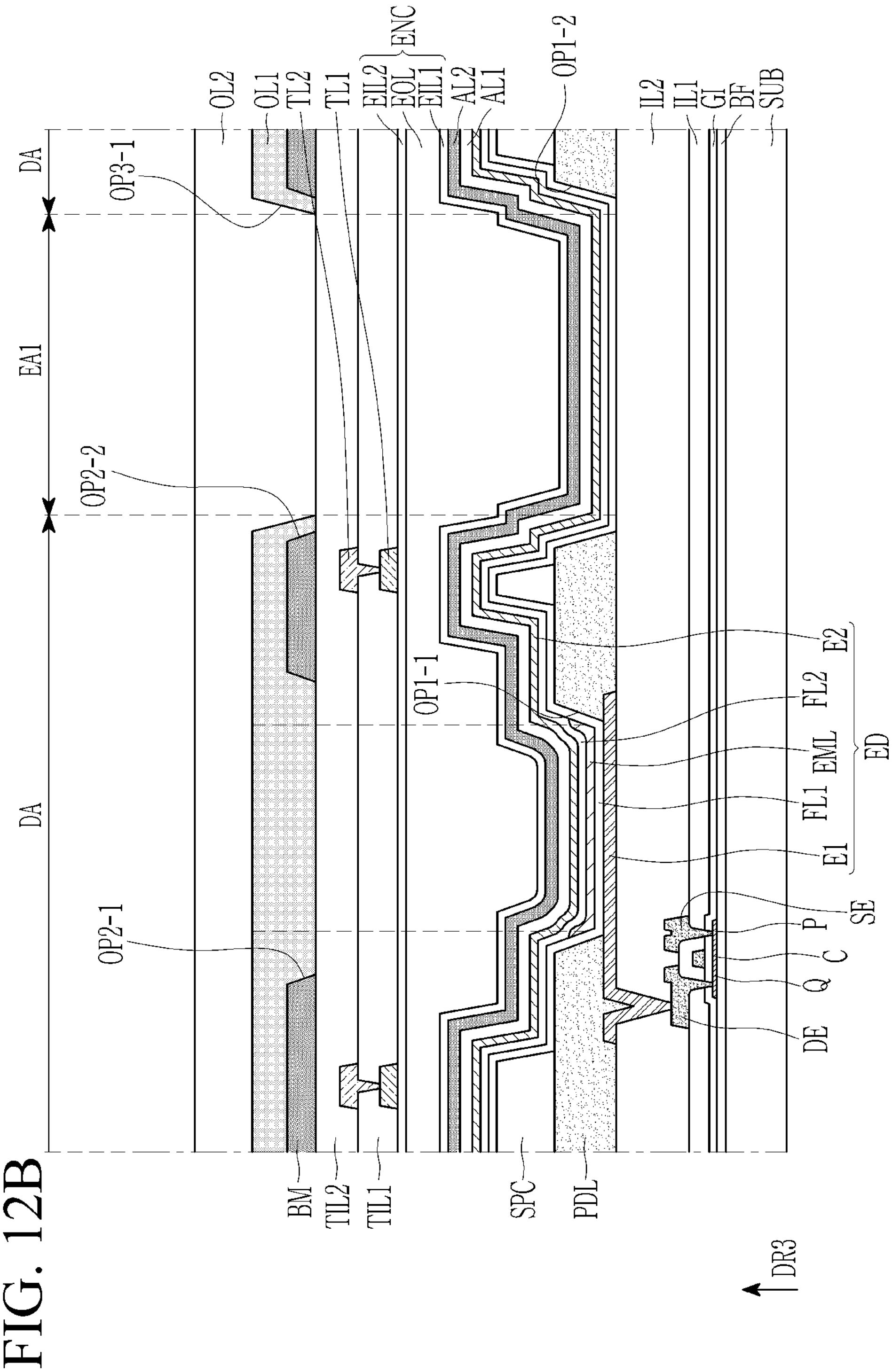
FIG. 12B is a cross-sectional view of a display device including a first element area according to still another embodiment.
Figure 12C:
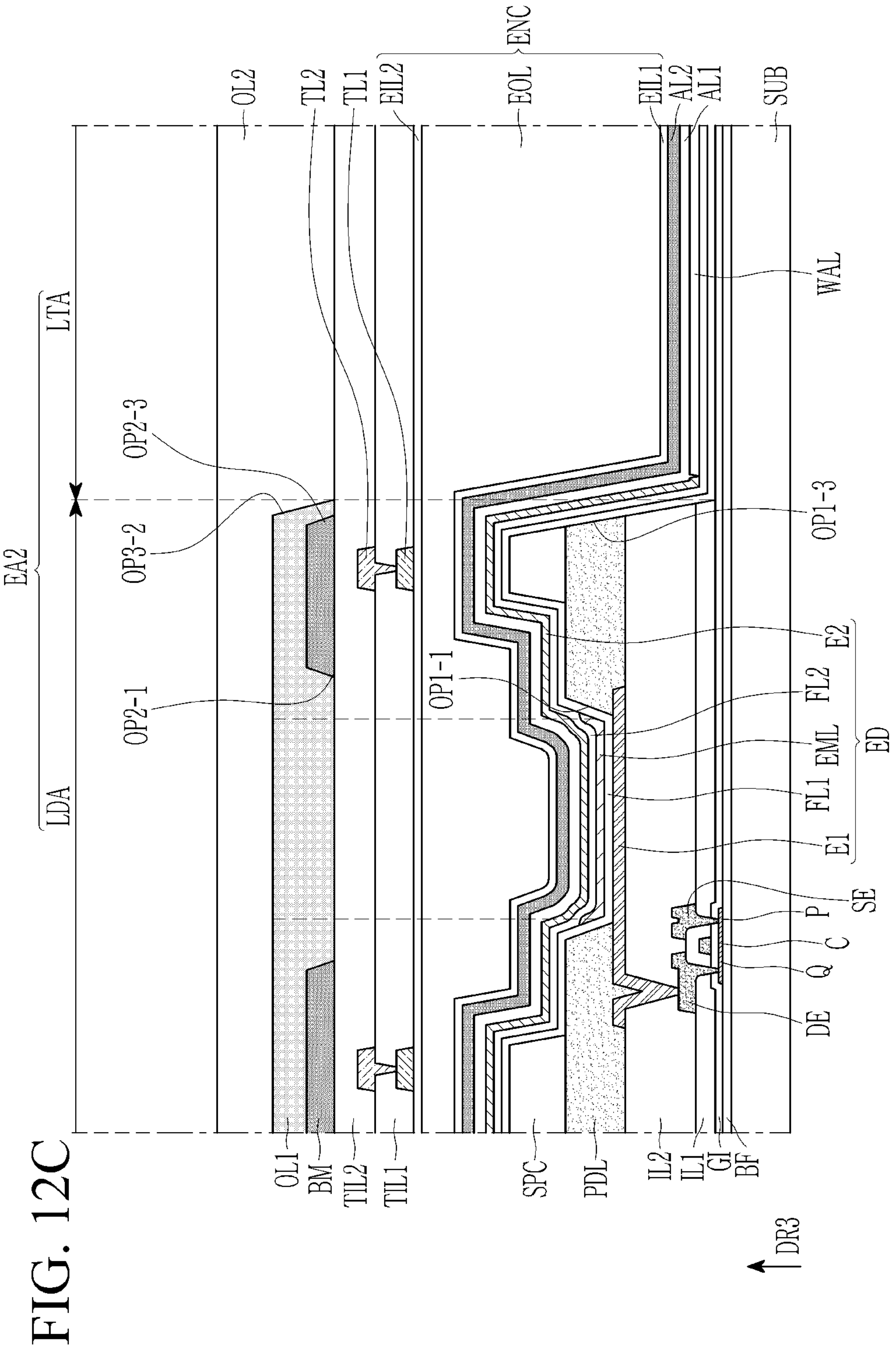
FIG. 12C is a cross-sectional view of the display device including a second element area according to still another embodiment.

Hereinafter, referring to FIG. 12A, FIG. 12B, and FIG. 12C, a display device according to still another embodiment will be described. FIG. 12A is a cross-sectional view of a display area of a display device according to still another embodiment, FIG. 12B is a cross-sectional view of a display device including a first element area according to still another embodiment, and FIG. 12C is a cross-sectional view of the display device including a second element area according to still another embodiment. A description of the above-described constituent elements will be omitted.

In embodiments of FIG. 12A, FIG. 12B, and FIG. 12C, a second organic layer may be removed compared to the embodiments of FIG. 7, FIG. 9A, and FIG. 10A. According to the embodiment, a first organic layer OL2 positioned on a reflection adjusting layer OL1 may be provided in a form that overlaps a front surface of a substrate SUB in the plan view. The first organic layer OL2 may provide a flat top surface without separate openings. According to the embodiment, the first organic layer OL2 may also overlap the emission layer EML in the plan view. According to such an embodiment, it is possible to provide a display device with a more simplified process.

Figure 13A:
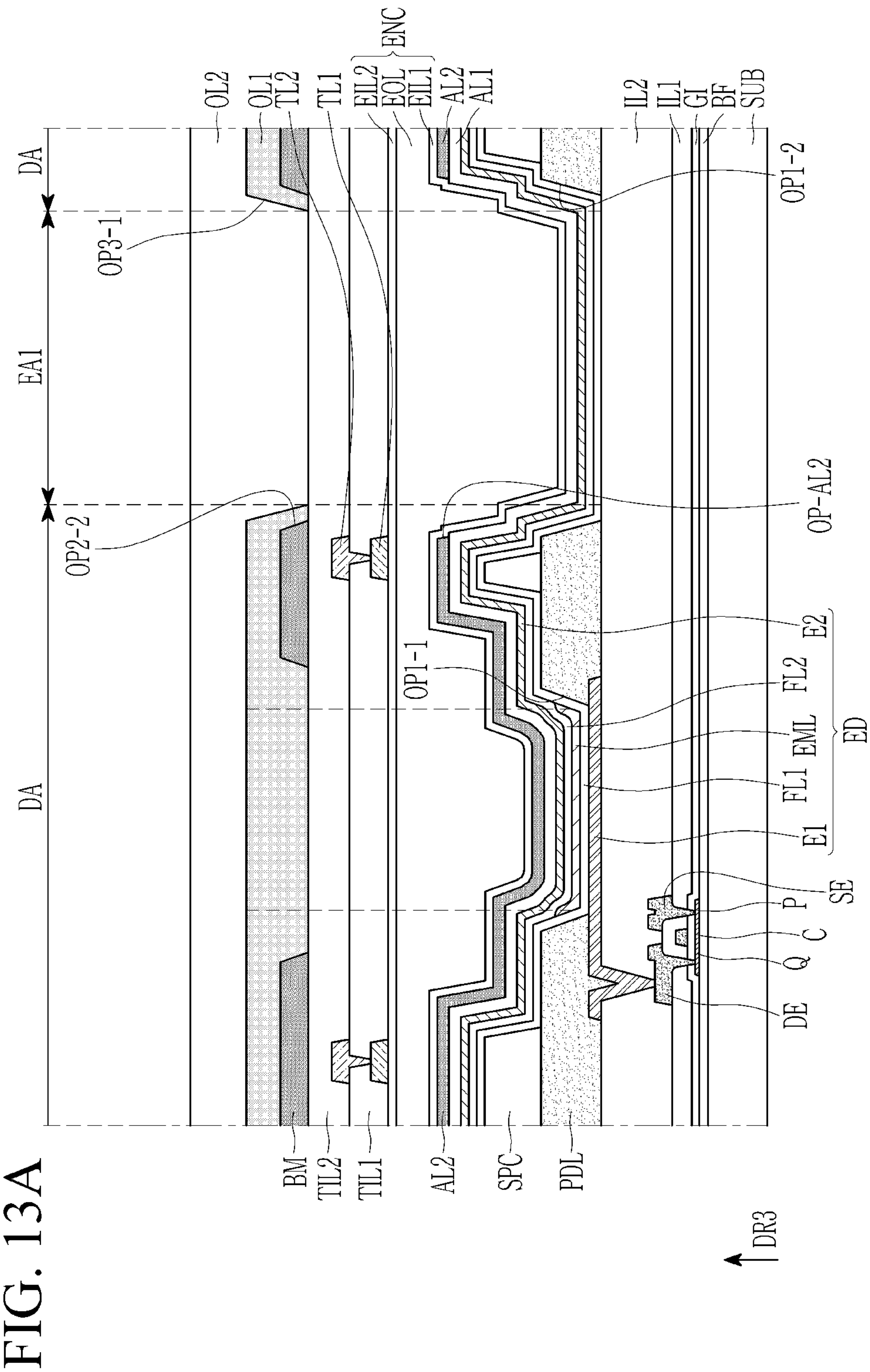
FIG. 13A is a cross-sectional view of a display device including a first element area according to yet another embodiment.
Figure 13B:
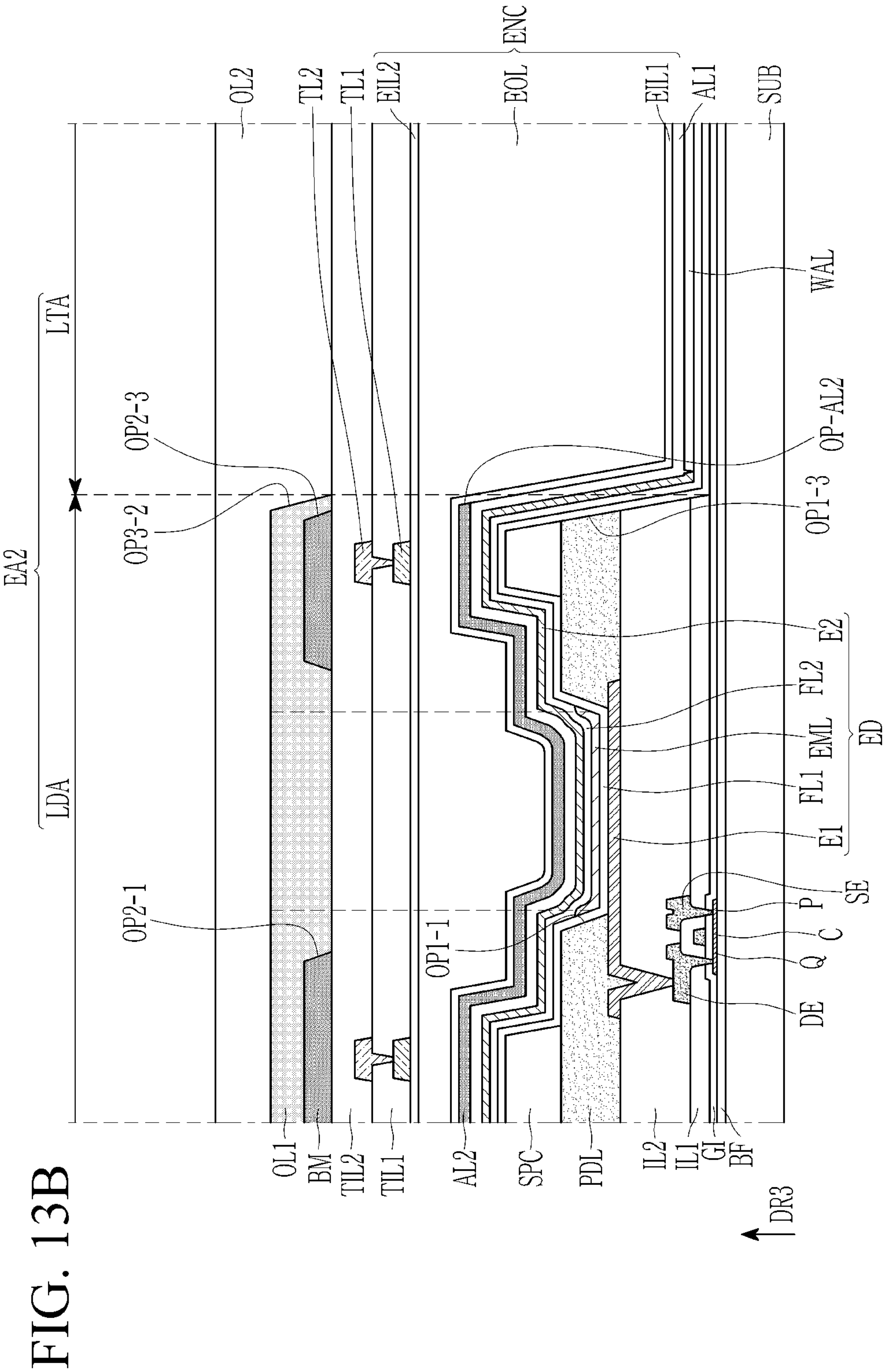
FIG. 13B is a cross-sectional view of a display device including a second element area according to yet another embodiment.

Hereinafter, referring to FIG. 13A and FIG. 13B, a display device according to yet another embodiment will be described. FIG. 13A is a cross-sectional view of a display device including a first element area according to yet another embodiment, and FIG. 13B is a cross-sectional view of a display device including a second element area according to yet another embodiment. A description of the above-described constituent elements will be omitted.

In embodiments of FIG. 13A and FIG. 13B, a second organic layer may be removed compared to the embodiments of FIG. 11A and FIG. 11B. According to an embodiment, a first organic layer OL2 positioned on a reflection adjusting layer OL1 may be provided in a form that overlaps a front surface of a substrate SUB in the plan view. The first organic layer OL2 may provide a flat top surface without separate openings. According to the embodiment, the first organic layer OL2 may also overlap with an emission layer EML in the plan view. According to such an embodiment, it is possible to provide a display device with a more simplified process.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

<Description of symbols>

| | |
|---|---|
| SUB: substrate | E1: first electrode |
| EML: emission layer | E2: second electrode |
| AL2: low reflective layer | ENC: encapsulation layer |
| BM: light blocking layer | OL1: reflection adjusting layer |
| OL2: first organic layer | OL3: second organic layer |

What is claimed is:

1. A display device comprising:

a substrate;

a light emitting element which is disposed on the substrate, and includes a first electrode, an emission layer, and a second electrode;

a reflective layer which is disposed on the light emitting element, and includes an inorganic material;

an encapsulation layer including a first encapsulation inorganic layer, an encapsulation organic layer, and a second encapsulation inorganic layer, which are disposed on the reflective layer;

a light blocking layer which is disposed on the encapsulation layer, and defines a 2-1 opening overlapping the emission layer in a plan view;

a reflection adjusting layer which is disposed on the light blocking layer and selectively absorbs a certain wavelength region in a visible light region;

a first organic layer which is disposed on the reflection adjusting layer, and defines therein an opening overlapping the emission layer in the plan view; and a second organic layer filled in the opening defined in the first organic layer, wherein the first organic layer and the second organic layer are disposed over a first surface of the reflection adjusting layer, and the light blocking layer and the light emitting element are disposed under a second surface of the reflection adjusting layer opposite to the first surface.

2. The display device of claim 1, comprising:

a display area and a peripheral area which surrounds the display area, wherein the display area comprises a first element area and a second element area.

3. The display device of claim 2, further comprising:

a pixel defining layer which is disposed on the substrate, and includes a light blocking material, wherein the pixel defining layer defines:

a 1-1 opening overlapping at least a part of the first electrode in the plan view;

a 1-2 opening overlapping the first element area in the plan view; and a 1-3 opening overlapping the second element area in the plan view.

4. The display device of claim 3, wherein the light blocking layer defines:

the 2-1 opening overlapping the 1-1 opening in the plan view;

a 2-2 opening overlapping the 1-2 opening in the plan view; and a 2-3 opening overlapping the 1-3 opening in the plan view.

5. The display device of claim 4, wherein the reflection adjusting layer defines:

a 3-1 opening overlapping the first element area in the plan view; and a 3-2 opening overlapping the second element area in the plan view.

6. The display device of claim 5, wherein the first organic layer is disposed in the 3-1 opening.

7. The display device of claim 5, wherein the first organic layer is disposed in the 3-2 opening.

8. The display device of claim 5, further comprising:

a spacer disposed on the pixel defining layer.

9. The display device of claim 1, wherein a refractive index of the second organic layer is greater than a refractive index of the first organic layer.

10. The display device of claim 1, wherein the first organic layer overlaps an entire surface of the substrate in the plan view.

11. The display device of claim 2, wherein the reflective layer comprises ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof.

12. The display device of claim 11, wherein the reflective layer overlaps a front surface of the substrate in the plan view.

13. The display device of claim 11, wherein the reflective layer defines an opening which overlaps at least one of the first element area and the second element area in the plan view.

14. The display device of claim 1, wherein the reflection adjusting layer selectively absorbs a first wavelength region and a second wavelength region in the visible light region, and the first wavelength region is 480 nanometers (nm) to 505 nm, and the second wavelength region is 585 nm to 605 nm.

15. An electronic device comprising:

a substrate comprising a display area and a peripheral area;

a light emitting element which is disposed on the substrate, and includes a first electrode, an emission layer, and a second electrode;

a pixel defining layer which overlaps at least a part of the first electrode in a plan view, and includes a light blocking material;

a reflective layer which is disposed on the second electrode, and contains an inorganic material;

an encapsulation layer including a first encapsulation inorganic layer, an encapsulation organic layer, and a second encapsulation inorganic layer, which are disposed on the reflective layer;

a light blocking layer which is disposed on the encapsulation layer;

a reflection adjusting layer, which is selectively absorbs a certain wavelength region in a visible light region;

a first organic layer which are disposed on the light blocking layer, wherein the first organic layer defines therein an opening overlapping the emission layer in the plan view; and a second organic layer filled in the opening defined in the first organic layer, wherein the first organic layer and the second organic layer are disposed over a first surface of the reflection adjusting layer, and the light blocking layer and the light emitting element are disposed under a second surface of the reflection adjusting layer opposite to the first surface.

16. The electronic device of claim 15, comprising:

a first element area and a second element area which are disposed in the display area.

17. The electronic device of claim 16, wherein the reflection adjusting layer is spaced apart from the first element area and at least a part of the second element area in the plan view.

18. The electronic device of claim 16, wherein the first organic layer overlaps the first element area and the second element area in the plan view, and the pixel defining layer and the light blocking layer are spaced apart from the first element area and the at least a part of the second element area in the plan view.

19. The electronic device of claim 15, wherein the reflective layer overlaps a front surface of the substrate in the plan view.

20. The electronic device of claim 16, wherein the reflective layer defines an opening which overlaps the first element area and an opening which overlaps the second element area in the plan view.

* * * * *